United States Patent
Nishijima et al.

(10) Patent No.: US 9,873,393 B2
(45) Date of Patent: Jan. 23, 2018

(54) ON-VEHICLE ELECTRICAL STORAGE APPARATUS

(71) Applicant: MITSUBISHI ELECTRIC CORPORATION, Tokyo (JP)

(72) Inventors: Yoshimasa Nishijima, Tokyo (JP); Shingo Yamaguchi, Tokyo (JP); Satoshi Wachi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 247 days.

(21) Appl. No.: 14/891,974

(22) PCT Filed: Sep. 17, 2013

(86) PCT No.: PCT/JP2013/075029
§ 371 (c)(1),
(2) Date: Nov. 18, 2015

(87) PCT Pub. No.: WO2015/040673
PCT Pub. Date: Mar. 26, 2015

(65) Prior Publication Data
US 2016/0090052 A1 Mar. 31, 2016

(51) Int. Cl.
*B60R 16/023* (2006.01)
*G01R 31/36* (2006.01)
(Continued)

(52) U.S. Cl.
CPC ............ *B60R 16/0238* (2013.01); *B60L 1/00* (2013.01); *B60L 3/00* (2013.01); *B60L 3/0092* (2013.01);
(Continued)

(58) Field of Classification Search
None
See application file for complete search history.

(56) References Cited

U.S. PATENT DOCUMENTS 6,330,463 B1 12/2001 Hedrich
2004/0263347 A1* 12/2004 Yasui ........................ H02J 1/00
340/12.19
(Continued)

FOREIGN PATENT DOCUMENTS

CN 102481851 A 5/2012
CN 102687365 A 9/2012
(Continued)

OTHER PUBLICATIONS

Communication dated May 25, 2017 from the State Intellectual Property Office of the P.R.C. In counterpart Application No. 201380079627.4.
(Continued)

*Primary Examiner* — Jared Fureman
*Assistant Examiner* — Aqeel Bukhari
(74) *Attorney, Agent, or Firm* — Sughrue Mion, PLLC; Richard C. Turner

(57) ABSTRACT

An auxiliary battery which is a main power supply is used as power source electric power supplying means for supplying power source electric power to a control device, and an auxiliary power supply is further provided. When an abnormality occurs in the auxiliary battery, the power supply for supplying power source electric power to the control device is switched from the auxiliary battery to the auxiliary power supply by a power supply switching device, to operate the control device stably and perform discharging of a battery. Thus, the discharging can be stopped before the battery is overdischarged.

20 Claims, 18 Drawing Sheets

(51) Int. Cl.
  *B60L 1/00* (2006.01)
  *B60R 16/033* (2006.01)
  *H02J 7/14* (2006.01)
  *B60L 3/00* (2006.01)
  *B60L 11/18* (2006.01)
  *H02J 7/00* (2006.01)
  *H02J 9/06* (2006.01)

(52) U.S. Cl.
  CPC ....... *B60L 11/1859* (2013.01); *B60L 11/1862* (2013.01); *B60L 11/1868* (2013.01); *B60R 16/033* (2013.01); *G01R 31/3606* (2013.01); *H02J 7/0029* (2013.01); *H02J 7/0063* (2013.01); *H02J 7/14* (2013.01); *H02J 9/061* (2013.01); *B60L 2250/10* (2013.01); *H02J 2007/0067* (2013.01); *Y02T 10/7005* (2013.01); *Y02T 10/7044* (2013.01); *Y02T 10/7066* (2013.01)

(56) References Cited

U.S. PATENT DOCUMENTS

| 2012/0070706 A1 | 3/2012 | Miyazaki et al. |
| 2012/0150393 A1 | 6/2012 | Knight-Newbury et al. |
| 2012/0293112 A1 | 11/2012 | Suzuki |
| 2013/0116871 A1 | 5/2013 | Hashimoto |
| 2015/0108951 A1* | 4/2015 | Yamaguchi ............. H02J 7/007 320/136 |

FOREIGN PATENT DOCUMENTS

| JP | 9-312937 A | 12/1997 |
| JP | 11266549 A | 9/1999 |
| JP | 2002233078 A | 8/2002 |
| JP | 3858797 B2 | 12/2006 |
| JP | 2008176967 A | 7/2008 |
| JP | 2011-129327 A | 6/2011 |
| JP | 2012070482 A | 4/2012 |
| JP | 2012-182890 A | 9/2012 |
| JP | 2013-504296 A | 2/2013 |
| JP | 2013-102580 A | 5/2013 |
| WO | 2014/057538 A1 | 4/2014 |

OTHER PUBLICATIONS

International Search Report of PCT/JP2013/075029, dated Oct. 29, 2013. [PCT/ISA/210].

Communication dated Aug. 30, 2016, from the Japanese Patent Office in counterpart application No. 2015-537446.

* cited by examiner

ON-VEHICLE ELECTRICAL STORAGE APPARATUS

CROSS REFERENCE TO RELATED APPLICATIONS

This application is a National Stage of International Application No. PCT/JP2013/075029 filed Sep. 17, 2013, the contents of all of which are incorporated herein by reference in their entirety.

TECHNICAL FIELD

This invention relates to an electrical storage apparatus to be incorporated in a vehicle, and more particularly, to an on-vehicle electrical storage apparatus having a plurality of power source electric power supply paths to a control device that controls discharging of a battery.

BACKGROUND ART

Conventionally, vehicles have a battery for temporarily storing electric energy generated by a power generator, which is connected to an internal combustion engine by a belt or the like. Thereby, it is possible to supply electric power that is necessary for the electrical equipment in the vehicle even under the condition where the internal combustion engine is not rotating and the power generator cannot generate electric power.

In addition, vehicles incorporating a plurality of batteries have emerged in recent years in order to charge the batteries by efficiently converting the energy of the vehicle during deceleration to electric energy. There is a case in which the plurality of batteries include a battery for efficiently storing the electric energy of the vehicle and a battery for use in, for example, starting the vehicle.

In an on-vehicle electrical storage apparatus provided with such batteries as described above, the wiring lines in or around the batteries are usually insulated so that an occupant, service persons, and so forth cannot directly touch them. However, when the vehicle experiences a collision, the insulated portion may be broken, and the possibility of electric shocks arises.

In view of this, PTL 1, for example, provides a control device of a vehicle including an engine starting device supplied with electric power from a battery, wherein when a vehicle collision is predicted, electric power supply to the battery is stopped and the battery is forcibly discharged to a minimum voltage that is necessary to start the engine by the engine starting device. Such a configuration makes it possible to start the engine while taking a measure to prevent electric shocks.

CITATION LIST

Patent Literature

PTL 1: Japanese Patent No. 3858797

SUMMARY OF INVENTION

Technical Problem

Nevertheless, the control device for a vehicle disclosed in PTL 1 does not take an abnormality in the power supply for supplying power source electric power to the control device into consideration. For this reason, there is a problem that, if an abnormality occurs in the power supply for the control device because of a vehicle collision or the like and the control device fails to operate, the discharge of the battery cannot be performed.

This invention has been accomplished in order to solve the problem as described above, and it is an object of the invention to provide an on-vehicle electrical storage apparatus that can operate a control device stably and is capable of performing discharging of a battery, even when an abnormality occurs in a power supply to the control device for the battery.

Solution to Problem

An on-vehicle electrical storage apparatus according to the invention including a battery incorporated in a vehicle and transferring electric power to and from equipment of the vehicle, a load for discharging the battery, a control device for controlling the discharging of the battery by the load, and power source to supply electric power to the control device, wherein: the control device has a state-of-charge detector to detect a state of charge of the battery, a processor to discharge the battery by the load and to stop the discharge of the battery before the battery is overdischarged based on the state of charge of the battery that is detected by the state-of-charge detector; and the power source has a plurality of electric power supply paths each including a power supply and a power supply line connecting the power supply to the control device so that, if an abnormality occurs in one of the paths that is supplying electric power to the control device, electric power is supplied to the control device by another one of the paths.

Advantageous Effects of Invention

The on-vehicle electrical storage apparatus according to the invention can supply power source electric power by another path and can operate the control device stably even when an abnormality occurs in a path that supplies power source electric power to the control device. Therefore, it is possible to discharge the battery and stop the discharging before the battery is overdischarged.

The foregoing and other objects, features, aspects, and advantages of the present invention will become more apparent from the following detailed description of the present invention when taken in conjunction with the accompanying drawings.

DESCRIPTION OF EMBODIMENTS

First Embodiment

Figure 1:
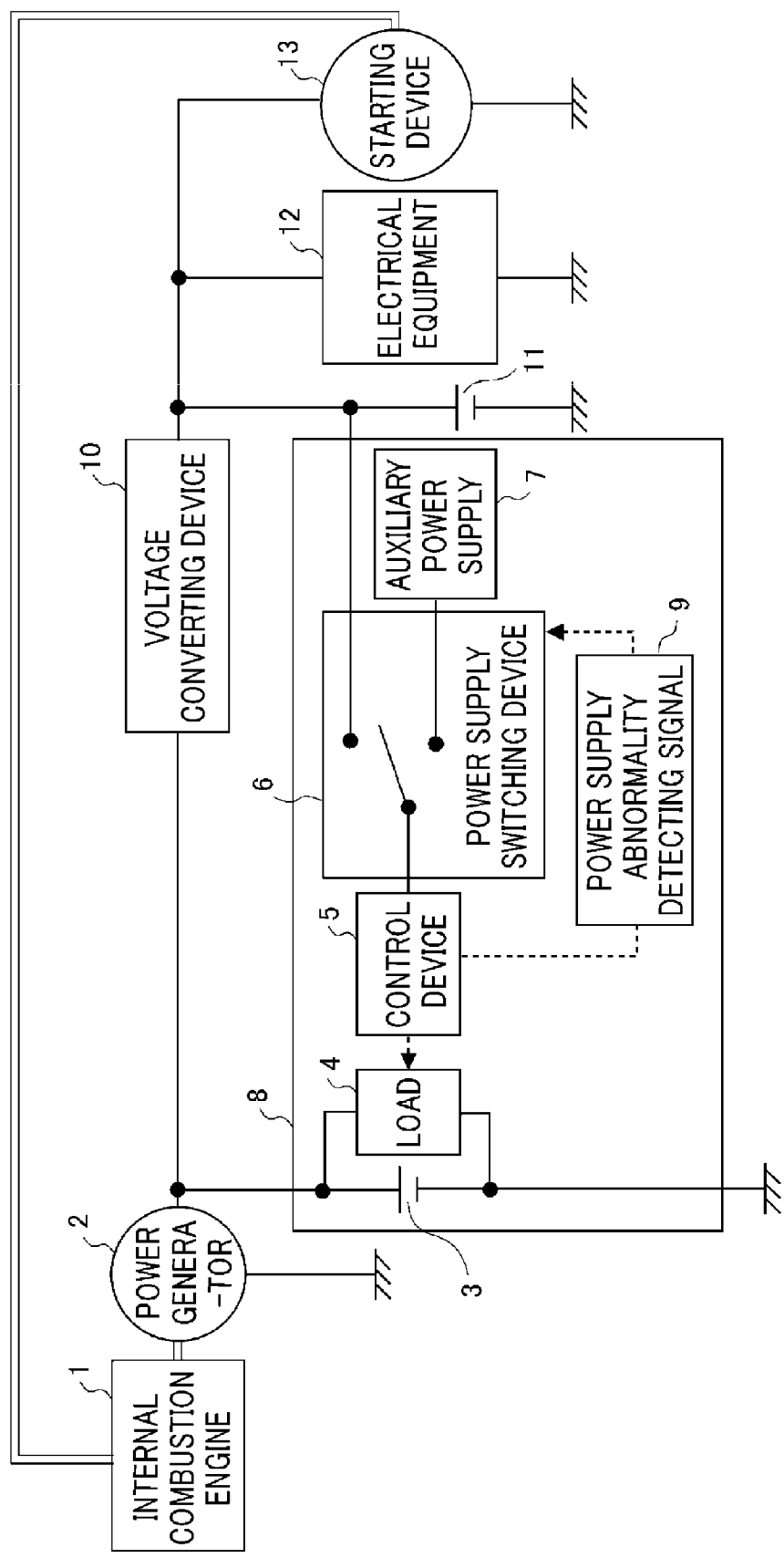
FIG. 1 is a diagram showing the configuration of a power supply system of an internal combustion engine that includes an on-vehicle electrical storage apparatus according to a first embodiment of the invention.

Hereinbelow, an on-vehicle electrical storage apparatus according to a first embodiment of the invention will be described with reference to the drawings. FIG. 1 shows an example of a power supply system of an internal combustion engine that includes the on-vehicle electrical storage apparatus according to the first embodiment. It should be noted that, in the drawings referred to hereinbelow, the same or corresponding component parts are designated by the same reference signs.

An internal combustion engine 1 of a vehicle (not shown) is connected to a power generator 2 by a belt or the like. A battery 3 that constitutes the on-vehicle electrical storage apparatus, a load 4 for discharging, a control device 5 for the battery 3 and an auxiliary power supply 7 thereto, and a power supply switching device 6 for changing the power supply to the control device 5, are accommodated in a case 8. It should be noted that an auxiliary battery 11, which is the main power supply for the control device 5, is disposed outside the case 8.

The load 4 for discharging the battery 3 is connected in parallel to the battery 3. The control device 5 for the battery 3 controls discharging caused by the load 4 and stopping of the discharging. The battery 3 is connected to the power generator 2 and also connected to electrical equipment 12 of the vehicle via a voltage converting device 10, and it transfers electric power between them.

Thus, when the internal combustion engine 1 rotates, the power generator 2 also rotates, so the electric energy generated by the power generator 2 is charged to the battery 3 or the auxiliary battery 11, and the voltage thereof is converted by the voltage converting device 10 so that it is consumed by the electrical equipment 12.

In FIG. 1, the voltage converting device 10 is provided because the voltage of the battery 3 and that of the auxiliary battery 11 are assumed to be different, but when the voltage of the battery 3 and that of the auxiliary battery 11 are substantially the same potential, it may be substituted by a switch or the like. A starting device 13 for starting the internal combustion engine 1 is supplied with electric power for driving from the auxiliary battery 11.

The control device 5 includes state-of-charge detecting means for detecting the state of charge of the battery 3, discharging means for discharging the battery 3 by the load 4, discharge stopping means for stopping the discharge of the battery 3 caused by the discharging means before the battery 3 is overdischarged based on the state of charge of the battery 3 that is detected by the state-of-charge detecting means, and power supply abnormality detecting means for detecting an abnormality in the power supply for supplying power source electric power to the control device 5 (all of which are not shown in the figure).

The state-of-charge detecting means calculates a state-of-charge value of the battery 3 based on the voltage, the charged and discharged current, and so forth of the battery 3. The discharge stopping means stops the discharging of the battery 3 caused by the discharging means if the state-of-charge value of the battery 3 calculated by the state-of-charge detecting means is equal to or less than a predetermined value at which overdischarge occurs.

Generally, when the battery 3 is overdischarged, deterioration is accelerated. In addition, when the overdischarged battery 3 is charged, a short circuit occurs inside the battery 3, and there is a possibility of causing ignition or smoke emission. For this reason, the overdischarged battery 3 cannot be reused even when it does not have a damage resulting from the impact at the time of a vehicle collision.

The battery 3 in the on-vehicle electrical storage apparatus according to the first embodiment is, for example, a lithium-ion battery. The auxiliary battery 11 may be a lithium-ion battery, or may be another type of battery. The lithium-ion battery is a secondary battery in which the positive electrode and the negative electrode provided in an electrolyte solution are insulated by a separator and lithium ions are transferred back and forth between the positive and negative electrodes to perform charging and discharging.

When the lithium-ion battery is overdischarged, the electrolyte solution is decomposed, and the copper used in the negative electrode is turned into ions, which are dissolved in the electrolyte solution in the battery. The dissolved copper ions are recrystallized by charging, which may be a cause of internal short circuit, in which the positive electrode and the negative electrode are short-circuited. Therefore, it is desirable to stop discharging before overdischarge occurs.

The on-vehicle electrical storage apparatus according to the invention is characterized by having a plurality of power source electric power supply paths each including a power supply and a power supply line that connects the power supply and the control device 5 to each other in power source electric power supplying means for supplying power source electric power to the control device 5. Thus, when an abnormality occurs in a path that supplies power source electric power to the control device 5, it is possible to supply power source electric power to the control device 5 through another path.

In the first embodiment, the plurality of power source electric power supply paths are formed by being provided with a plurality of power supplies. Specifically, the auxiliary battery 11, which is the main power supply, and the auxiliary power supply 7 are provided, as shown in FIG. 1. One power supply line is provided for connecting the control device 5 to each of the power supplies, the auxiliary battery 11 and the auxiliary power supply 7.

When the power supply abnormality detecting means of the control device 5 detects an abnormality such as wire breakage or voltage drop in the auxiliary battery 11, which is the main power supply, the power supply abnormality detecting means generates a power supply abnormality detecting signal 9 and outputs the signal to the power supply switching device 6. The power supply switching device 6, to which the power supply abnormality detecting signal 9 has been input, switches the power supply that supplies power source electric power to the control device 5 from the auxiliary battery 11 to the auxiliary power supply 7, so as to operate the control device 5 by the auxiliary power supply 7.

Although it is described that the power supply abnormality detecting signal 9 is generated by the control device 5 for the battery 3, the power supply abnormality detecting signal 9 may be generated by another control device (not shown). In addition, as the power source electric power supplying means for operating the control device 5, the auxiliary battery 11 is used as the main power supply in FIG. 1. However, the main power supply to the control device 5 is not limited to the auxiliary battery 11.

Next, the process flow of the control device 5 in the on-vehicle electrical storage apparatus according to the first embodiment will be described with reference to the flowchart of FIG. 2. The process operation of the control device 5 is performed periodically (for example, every 10 ms).

First, at step 101 (S101), if an abnormality in the auxiliary battery 11, which is the main power supply to the control device 5, is detected (YES), the control device 5 generates the power supply abnormality detecting signal 9, and the process proceeds to step 102 (S102). At S101, if no abnormality in the main power supply to the control device 5 is detected (NO), the process is ended.

At S102, the power supply switching device 6, to which the power supply abnormality detecting signal 9 has been input, switches the power supply to the control device 5 from the auxiliary battery 11, which is the main power supply, to the auxiliary power supply 7. Subsequently, the process proceeds to step 103 (S103), wherein the discharging means of the control device 5 starts the discharging of the battery 3 by the load 4.

After the discharging is started, the discharge stopping means of the control device 5 determines, at step 104 (S104), whether or not the state-of-charge value of the battery 3 (calculated based on the voltage, the charged and discharged current, and the like of the battery 3) that is detected by the state-of-charge detecting means is equal to or less than a predetermined value at which overdischarge occurs.

If it is determined that the state-of-charge value of the battery 3 is equal to or less than the predetermined value at which overdischarge occurs (YES) at S104, the process proceeds to step 105 (S105), wherein the discharge stopping means stops discharging of the battery 3, and the process is ended. If it is not equal to or less than the predetermined value at which overdischarge occurs (NO) at S104, the discharging is continued, and the determination at S104 is repeated.

As described above, in the on-vehicle electrical storage apparatus according to the first embodiment, the power source electric power supplying means for supplying power source electric power to the control device 5 uses the auxiliary battery 11 as the main power supply and further has the auxiliary power supply 7. Therefore, even when an abnormality occurs in the auxiliary battery 11, which is the main power supply, the power supply is switched to the auxiliary power supply 7 to operate the control device 5 stably and perform discharging of the battery 3. Thus, the discharging can be stopped before the battery 3 is overdischarged.

Moreover, when the auxiliary battery 11, which is the main power supply to the control device 5, is not abnormal, the auxiliary power supply 7 is not used, and only when the auxiliary battery 11 becomes abnormal, the auxiliary power supply 7 is used. Thereby, power consumption of the auxiliary power supply 7 can be suppressed. Furthermore, because the load 4 for discharging is enclosed in the case 8, it cannot be touched by a person, so electric shocks can be prevented. In addition, since a power supply that is different from the battery 3 is used as the auxiliary power supply, the control device 5 can be operated even when the voltage of the battery 3 is dropped by discharging.

Second Embodiment

Figure 3:
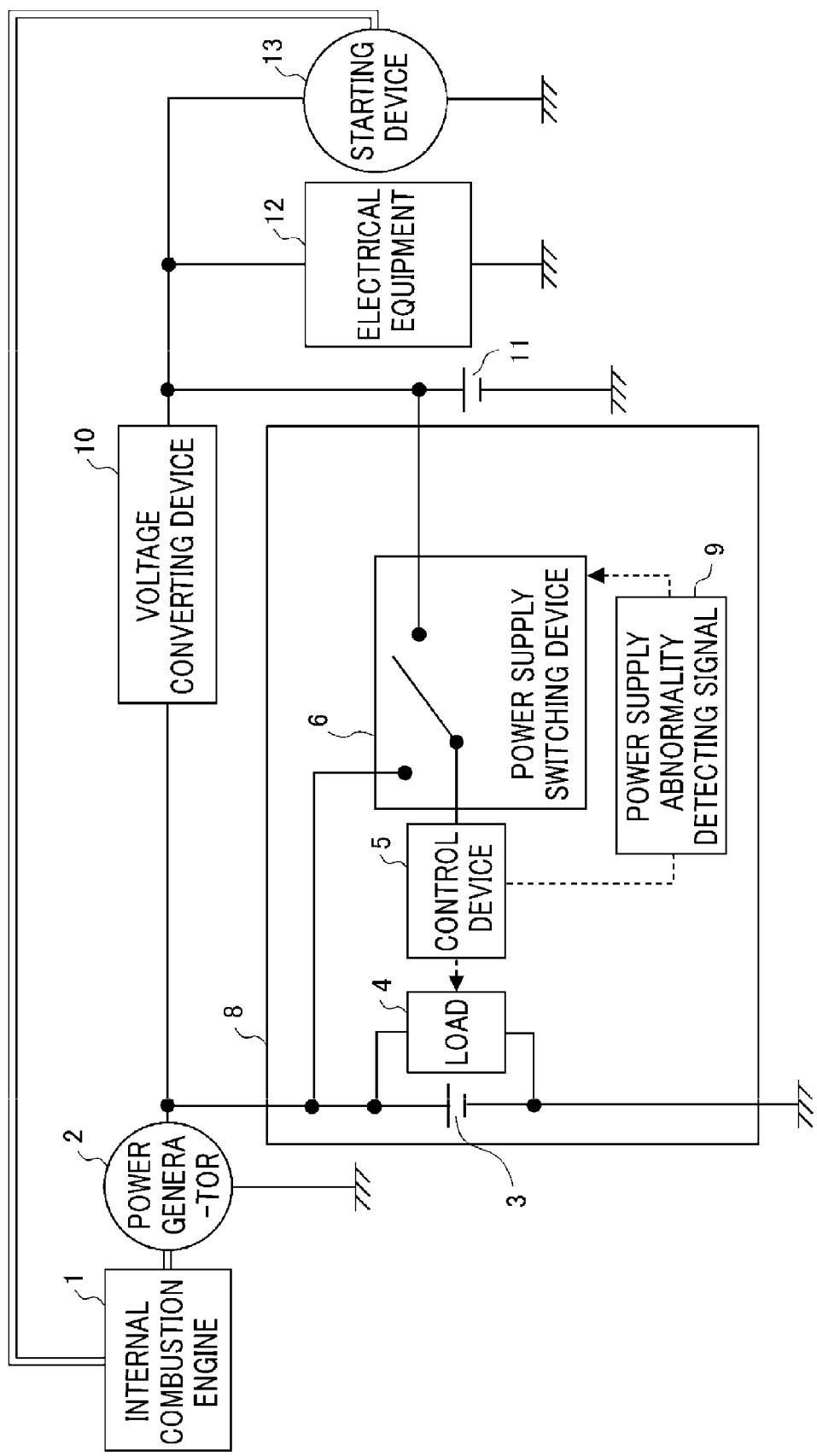
FIG. 3 is a diagram showing the configuration of a power supply system of an internal combustion engine that includes an on-vehicle electrical storage apparatus according to a second embodiment of the invention.

FIG. 3 shows one example of a power supply system of an internal combustion engine that includes an on-vehicle electrical storage apparatus according to a second embodiment of the invention. Similar to the foregoing first embodiment, the on-vehicle electrical storage apparatus according to the second embodiment includes a plurality of power supplies as the power source electric power supplying means for operating the control device 5.

The second embodiment uses the auxiliary battery 11 as the main power supply, similar to the foregoing first embodiment, but uses the battery 3 as the auxiliary power supply. By employing such a configuration, it is unnecessary to provide the auxiliary power supply 7 (see FIG. 1). The rest of the configuration is the same as that in the foregoing first embodiment, and therefore, the description thereof will be omitted.

According to the second embodiment, the need for providing an additional power supply is eliminated by using the existing battery 3 as the auxiliary power supply for the control device 5, and the parts count can be reduced.

Third Embodiment

Figure 4:
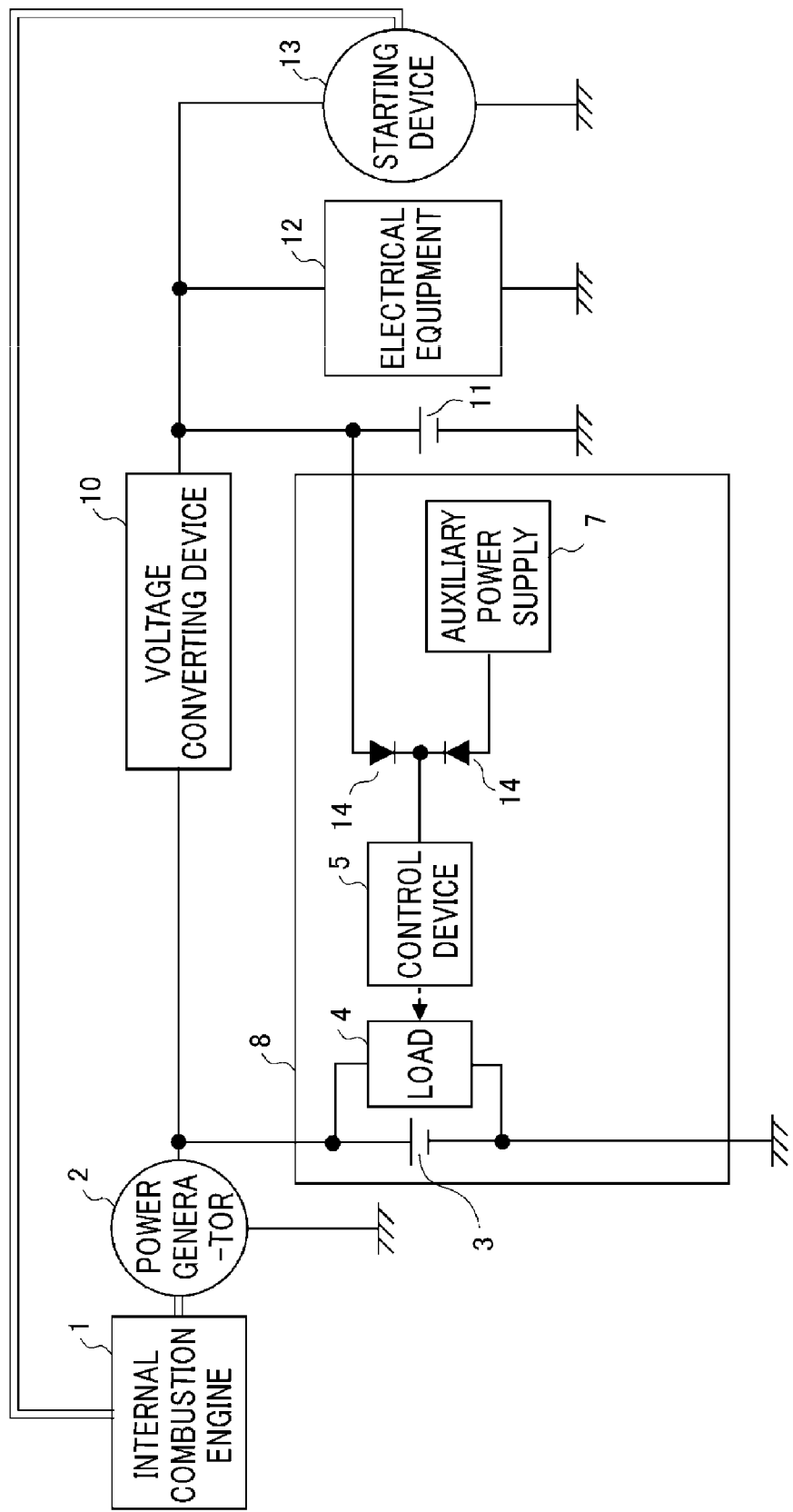
FIG. 4 is a diagram showing the configuration of a power supply system of an internal combustion engine that includes an on-vehicle electrical storage apparatus according to a third embodiment of the invention.

FIG. 4 shows one example of a power supply system of an internal combustion engine that includes an on-vehicle electrical storage apparatus according to a third embodiment of the invention. Similar to the foregoing first embodiment, the on-vehicle electrical storage apparatus according to the third embodiment includes the auxiliary battery 11, which is the main power supply, as well as the auxiliary power supply 7, as the power source electric power supplying means for operating the control device 5.

In the third embodiment, each of the plurality of power supplies, i.e., each of the auxiliary battery 11 and the battery 7, is connected to the control device 5 via a reverse current preventing diode 14, which is reverse current preventing means. By employing such a configuration, the power supply abnormality detecting means can be eliminated. The rest of the configuration is the same as that in the foregoing first embodiment, and therefore, the description thereof will be omitted.

According to the third embodiment, the power supply abnormality detecting means becomes unnecessary, in addition to the same advantageous effects as those of the foregoing first embodiment. Moreover, all the plurality of power supplies (the auxiliary battery 11 and the auxiliary power supply 7) are different ones from the battery 3, and the battery 3 is not used as the power supply for the control device 5. Therefore, the power consumption of the battery 3 resulting from the operation of the control device 5 can be prevented.

Fourth Embodiment

Figure 5:
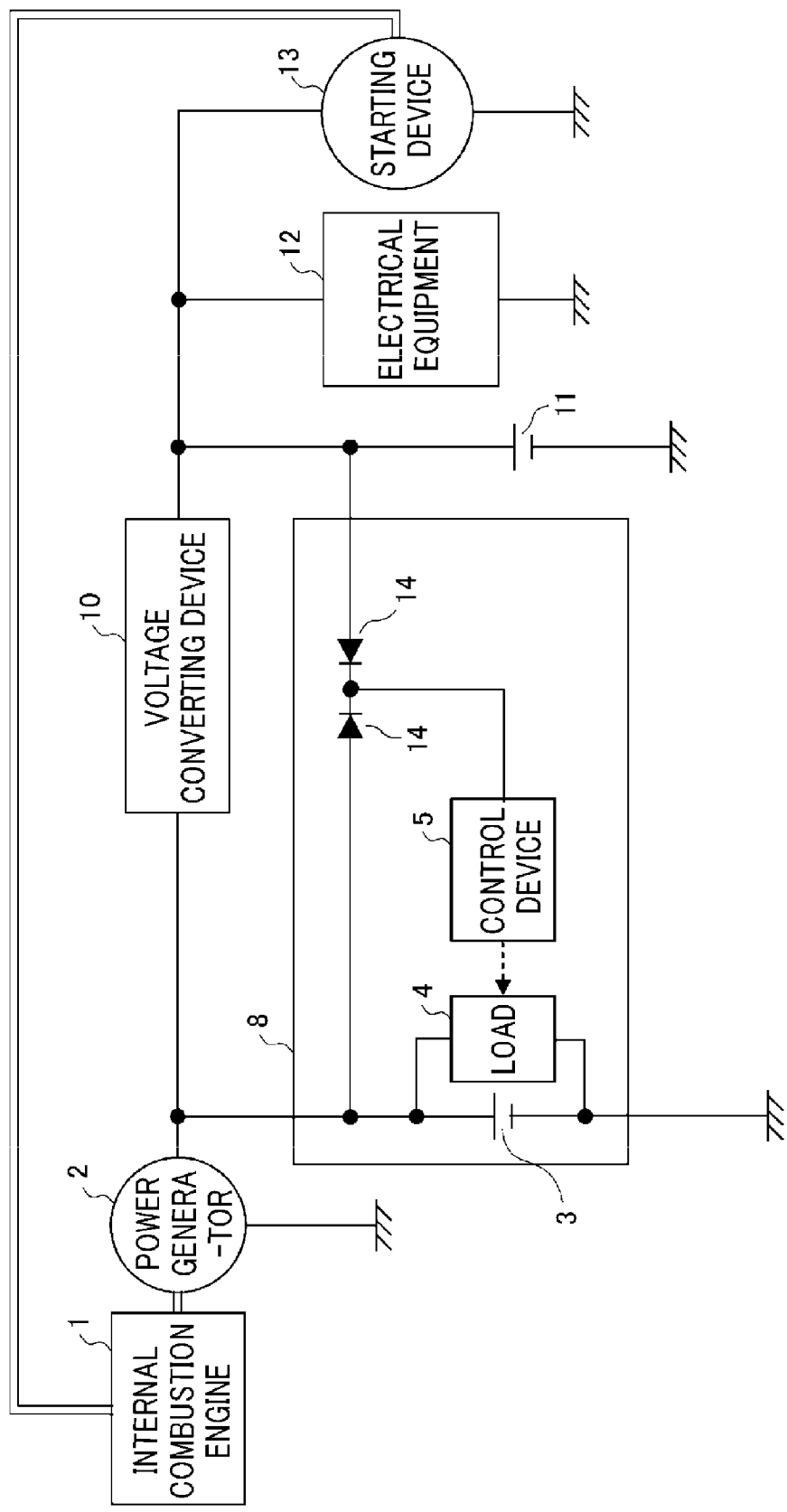
FIG. 5 is a diagram showing the configuration of a power supply system of an internal combustion engine that includes an on-vehicle electrical storage apparatus according to a fourth embodiment of the invention.

FIG. 5 shows one example of a power supply system of an internal combustion engine that includes an on-vehicle electrical storage apparatus according to a fourth embodiment of the invention. The on-vehicle electrical storage apparatus according to the fourth embodiment uses the auxiliary battery 11 as the main power supply for the control device 5 and the battery 3 as the auxiliary power supply, similar to the foregoing second embodiment.

In addition, each of the auxiliary battery 11 and the battery 3 is connected to the control device 5 via the reverse current preventing diode 14, which is the reverse current preventing means. The rest of the configuration is the same as that in the foregoing first embodiment, and therefore, the description thereof will be omitted.

The fourth embodiment does not need to provide an additional power supply because it uses the existing battery 3 as the auxiliary power supply for the control device 5.

Fifth Embodiment

Figure 6:
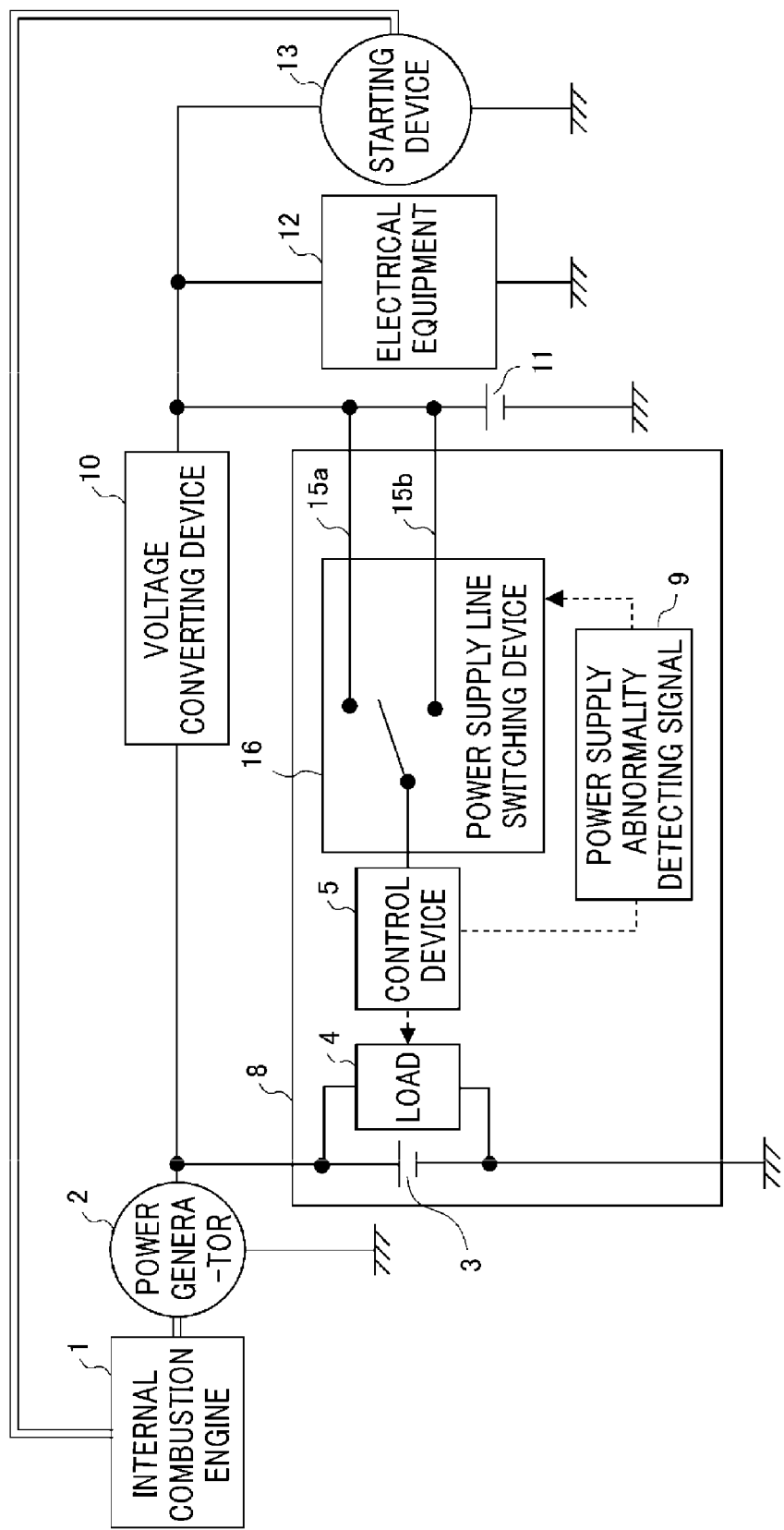
FIG. 6 is a diagram showing the configuration of a power supply system of an internal combustion engine that includes an on-vehicle electrical storage apparatus according to a fifth embodiment of the invention.

FIG. 6 shows one example of a power supply system of an internal combustion engine that includes an on-vehicle electrical storage apparatus according to a fifth embodiment of the invention. In the on-vehicle electrical storage apparatus according to the fifth embodiment, a plurality of power source electric power supply paths are provided by providing a plurality of power supply lines for one power supply (the auxiliary battery 11) as the power source electric power supplying means to the control device 5. Although two power supply lines 15*a* and 15*b* are shown in FIG. 6, the number of the power supply lines is not limited to two.

One of the two power supply lines 15*a* and 15*b* is a main power supply line, and the other one is an auxiliary power supply line. Herein, the description is given assuming that the power supply line 15*a* is the main power supply line. A power supply line switching device 16 switches the power supply line for supplying power source electric power to the control device 5 from the main power supply line 15*a* to the auxiliary power supply line 15*b* if an abnormality in the main power supply line 15*a* is detected. The rest of the configuration is the same as that in the foregoing first embodiment, and therefore, the description thereof will be omitted.

Figure 7:
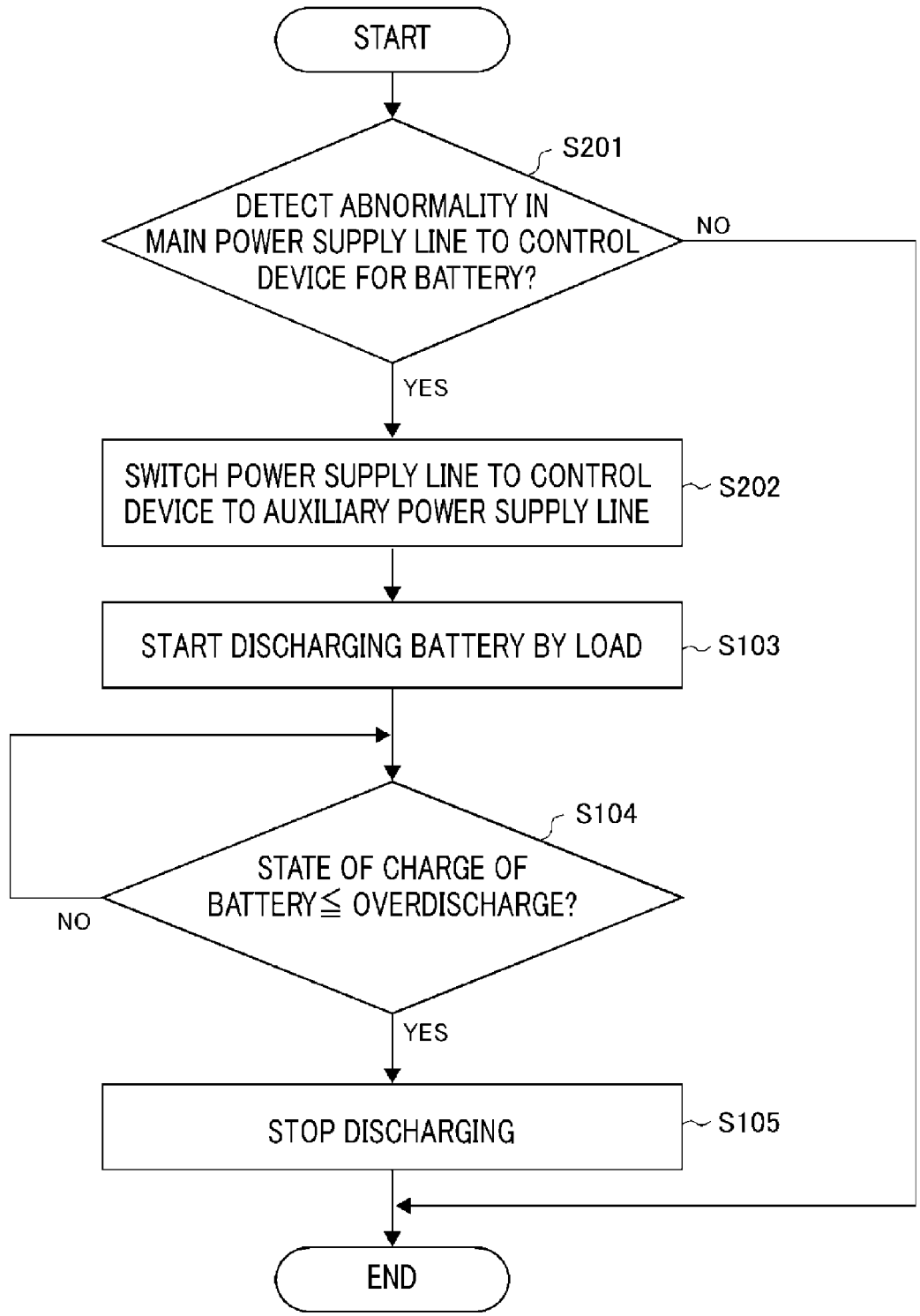
FIG. 7 is a diagram showing the flow of the process in a control device in the on-vehicle electrical storage apparatus according to the fifth embodiment of the invention.

Next, the process flow of the control device 5 in the on-vehicle electrical storage apparatus according to the fifth embodiment will be described with reference to the flow-chart of FIG. 7. The process operation of the control device 5 is performed periodically (for example, every 10 ms).

First, at step 201 (S201), if an abnormality in the main power supply line 15*a* to the control device 5 is detected (YES), the control device 5 generates the power supply abnormality detecting signal 9, and the process proceeds to step 202 (S202). At S201, if no abnormality in the main power supply line 15*a* to the control device 5 is detected (NO), the process is ended.

At S202, the power supply line switching device 16, to which the power supply abnormality detecting signal 9 has been input, switches the power supply line to the control device 5 from the main power supply line 15*a* to the auxiliary power supply line 15*b*. S103 to S105, which follow S202, are the same as those in the flow-chart of FIG. 2, which has been explained in the foregoing first embodiment. Therefore, the description thereof will be omitted.

The on-vehicle electrical storage apparatus according to the fifth embodiment has a plurality of power supply lines for supplying power source electric power to the control device 5. Therefore, even when an abnormality occurs in the main power supply line 15*a* which supplies power source electric power to the control device 5, the power supply line is switched to the auxiliary power supply line 15*b* to operate the control device 5 stably and perform discharging of the battery 3. Thus, it is possible to stop the discharging before the battery 3 is overdischarged.

Moreover, the configuration is such that the existing auxiliary battery 11 is used as the power supply to the control device 5 and power supply lines are added thereto. Therefore, it is unnecessary to provide an additional power supply.

Sixth Embodiment

Figure 8:
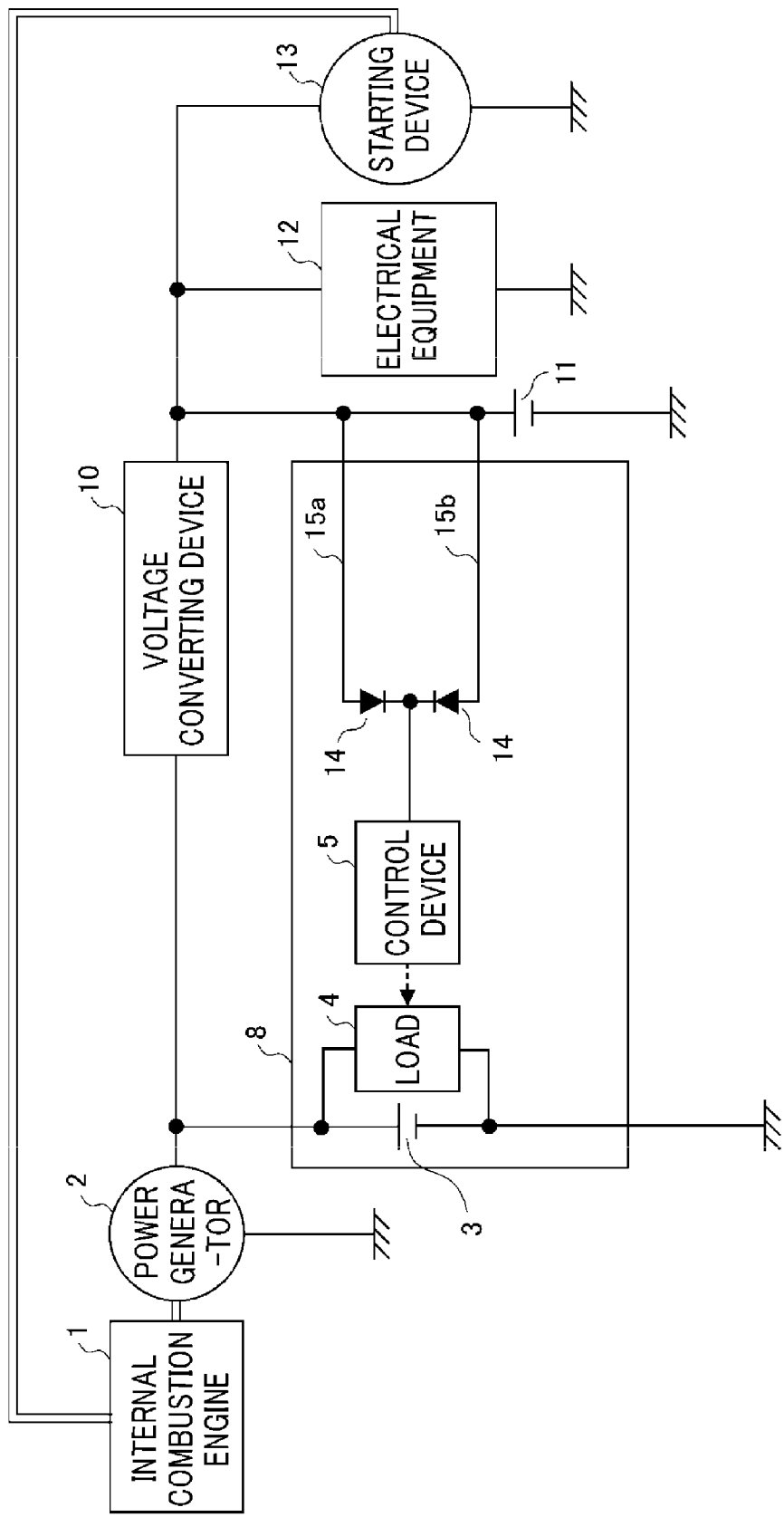
FIG. 8 is a diagram showing the configuration of a power supply system of an internal combustion engine that includes an on-vehicle electrical storage apparatus according to a sixth embodiment of the invention.

FIG. 8 shows one example of a power supply system of an internal combustion engine that includes an on-vehicle electrical storage apparatus according to a sixth embodiment of the invention. Similar to the foregoing fifth embodiment, the on-vehicle electrical storage apparatus according to the sixth embodiment is provided with the two power supply lines 15*a* and 15*b* for one power supply (the auxiliary battery 11) as the power source electric power supplying means to the control device 5.

In the sixth embodiment, each of the two power supply lines 15*a* and 15*b* is connected to the control device 5 via the reverse current preventing diode 14, which is the reverse current preventing means. The rest of the configuration is the same as that in the foregoing first embodiment, and therefore, the description thereof will be omitted.

According to the sixth embodiment, the power supply abnormality detecting means can be eliminated by using the reverse current preventing diode 14, in addition to the same advantageous effects as those of the foregoing fifth embodiment.

Seventh Embodiment

Figure 9:
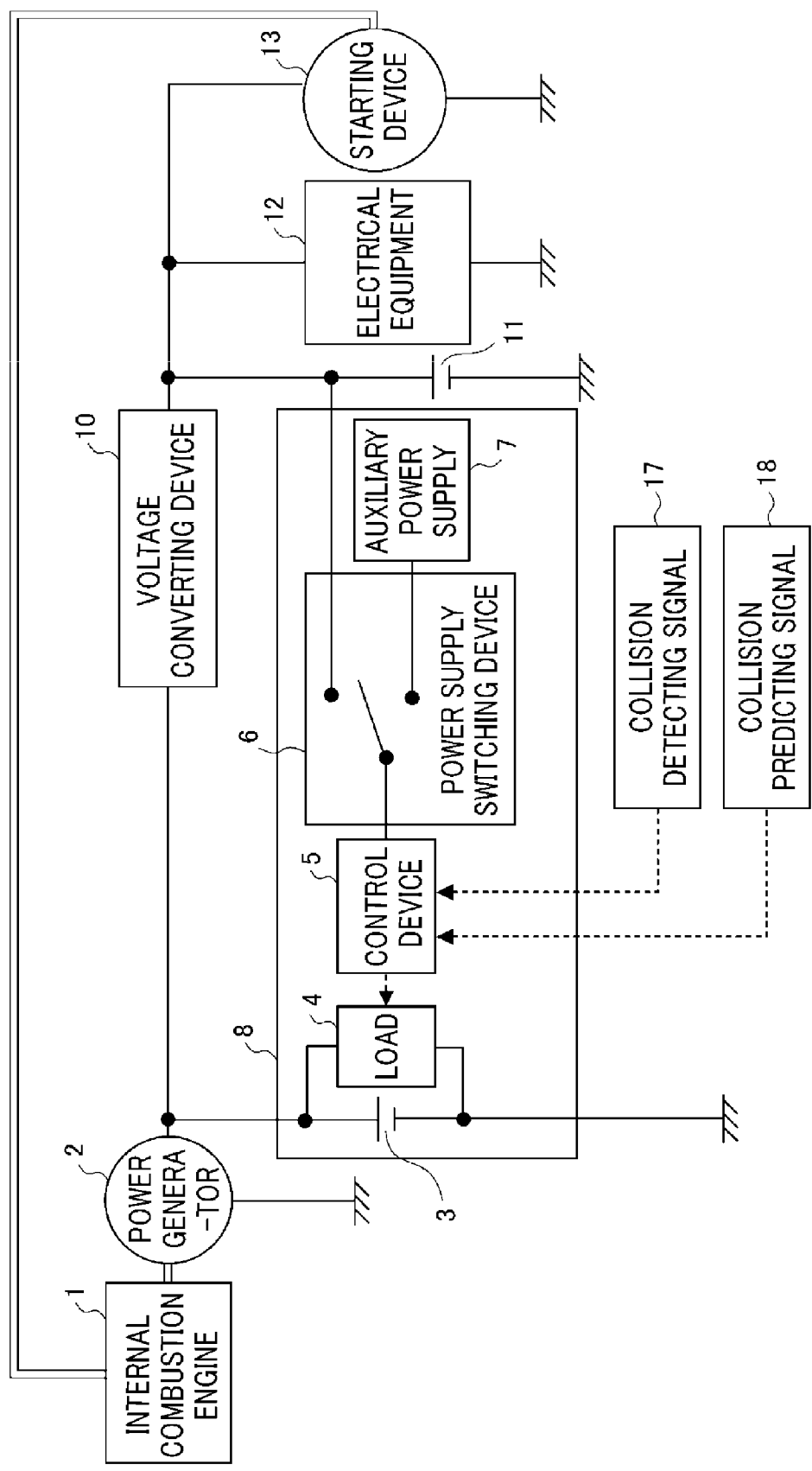
FIG. 9 is a diagram showing the configuration of a power supply system of an internal combustion engine that includes an on-vehicle electrical storage apparatus according to a seventh embodiment of the invention.

FIG. 9 shows one example of a power supply system of an internal combustion engine that includes an on-vehicle electrical storage apparatus according to a seventh embodiment of the invention. The on-vehicle electrical storage apparatus according to the seventh embodiment is provided with vehicle collision detecting means (not shown) for detecting or predicting a vehicle collision. If a collision is detected or predicted by the vehicle collision detecting means, the control device 5 performs discharging of the battery 3 caused by the discharging means. The rest of the configuration is the same as that in the foregoing first embodiment, and therefore, the description thereof will be omitted.

As shown in FIG. 9, a collision detecting signal 17 and a collision predicting signal 18, which are output from the vehicle collision detecting means, are input to the control device 5. The collision detecting signal 17 is generated by, for example, a control device for an air bag (not shown). The collision predicting signal 18 is generated by, for example, a frontward sensing radar or a control device for a camera (both of which are not shown in the figure). It is also possible to use only one of the collision detecting signal 17 and the collision predicting signal 18.

If a collision is detected or predicted by the vehicle collision detecting means, the control device 5 switches the main power supply to the auxiliary power supply 7 to perform discharging by the load 4 even before the power supply abnormality detecting means detects an abnormality such as wire breakage in the auxiliary battery 11, which is the main power supply.

Figure 10:
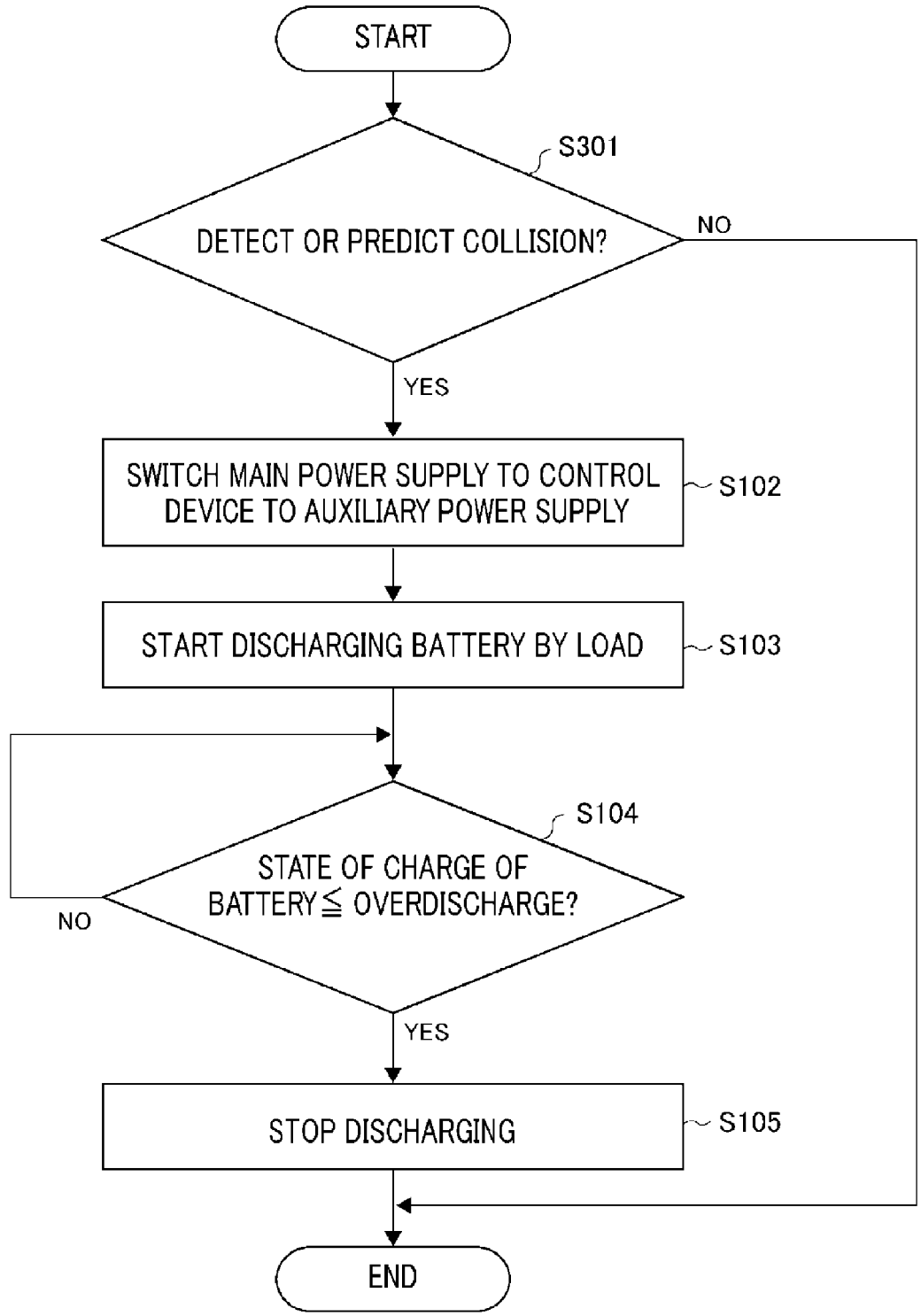
FIG. 10 is a diagram showing the flow of the process in a control device in the on-vehicle electrical storage apparatus according to the seventh embodiment of the invention.

Next, the process flow of the control device 5 in the on-vehicle electrical storage apparatus according to the seventh embodiment will be described with reference to the flow-chart of FIG. 10. The process operation of the control device 5 is performed periodically (for example, every 10 ms).

First, at step 301 (S301), if a collision of the vehicle is detected or predicted by the collision detecting signal 17 or the collision predicting signal 18 that are output by the vehicle collision detecting means (YES), the process proceeds to S102, wherein the power supply switching device 6 switches the power supply to the control device 5 from the auxiliary battery 11, which is the main power supply, to the auxiliary power supply 7.

At S301, if no collision of the vehicle is detected or predicted, the process is ended. S103 to S105 are the same as those in the flow-chart of FIG. 2, which has been explained in the foregoing first embodiment. Therefore, the description thereof will be omitted.

According to the seventh embodiment, the vehicle collision detecting means for detecting or predicting a collision of a vehicle is provided. Therefore, at the time of collision of the vehicle, it is possible to perform discharging of the battery 3 and stop the discharging before the state of charge of the battery 3 becomes overdischarge, even before an abnormality in the power supply to the control device 5 is detected, in addition to the same advantageous effects as those of the foregoing first embodiment.

Eighth Embodiment

Figure 11:
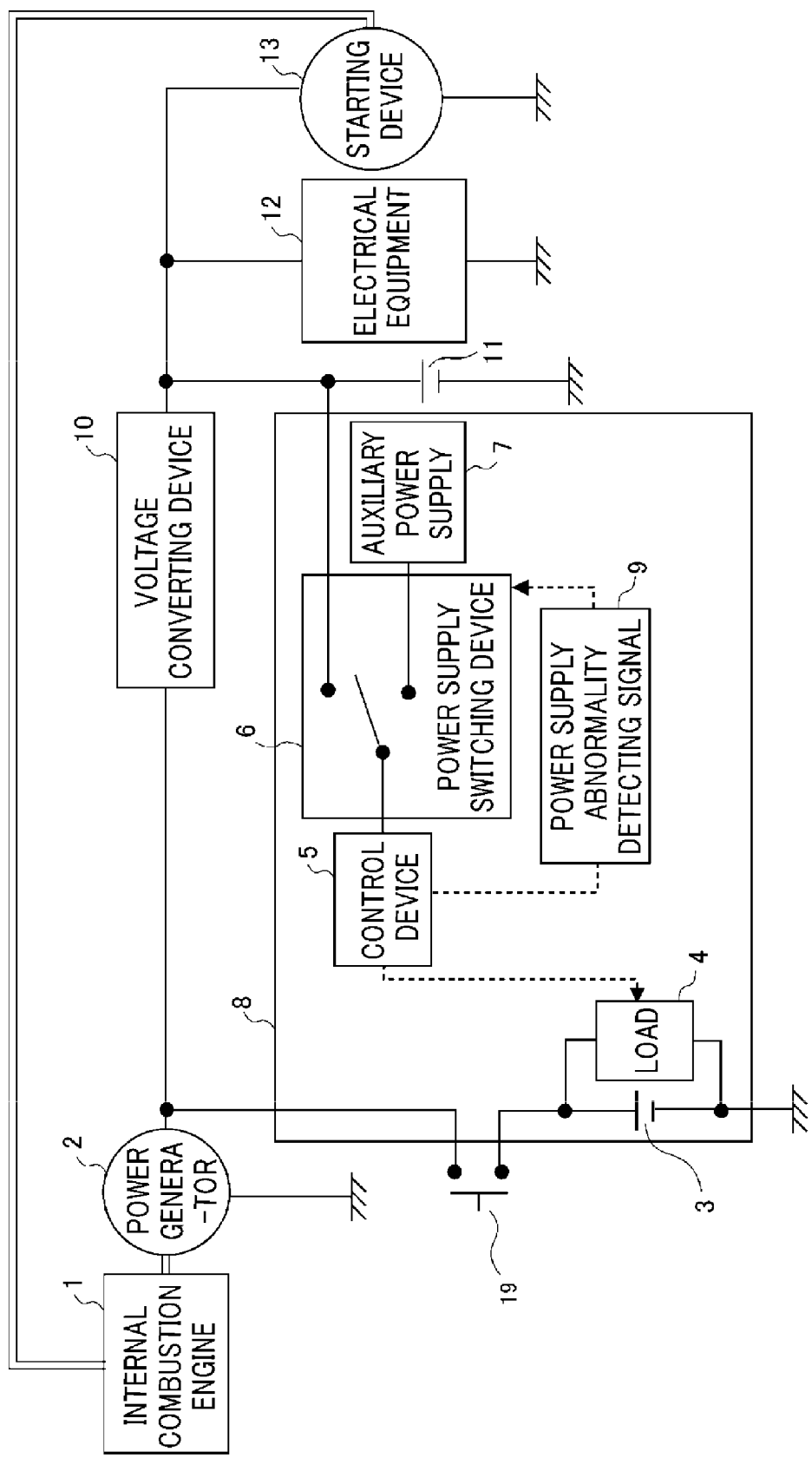
FIG. 11 is a diagram showing the configuration of a power supply system of an internal combustion engine that includes an on-vehicle electrical storage apparatus according to an eighth embodiment of the invention.

FIG. 11 shows one example of a power supply system of an internal combustion engine that includes an on-vehicle electrical storage apparatus according to an eighth embodiment of the invention. The on-vehicle electrical storage apparatus according to the eighth embodiment is provided with a cut-off device 19 for cutting off the connection between the battery 3 and the electrical equipment 12 of the vehicle. The rest of the configuration is the same as that in the foregoing first embodiment, and therefore, the description thereof will be omitted.

The user can cut off the connection between the battery 3 and the electrical equipment 12 by operating the cut-off device 19. In addition, when the connection between the battery 3 and the electrical equipment 12 is cut off by the cut-off device 19, the control device 5 stops discharging of the battery 3 caused by the discharging means. In FIG. 11, the cut-off device 19 is provided between the battery 3 and the electrical equipment 12. However, when there are a plurality of batteries, the cut-off device 19 may be provided between those batteries.

Figure 12:
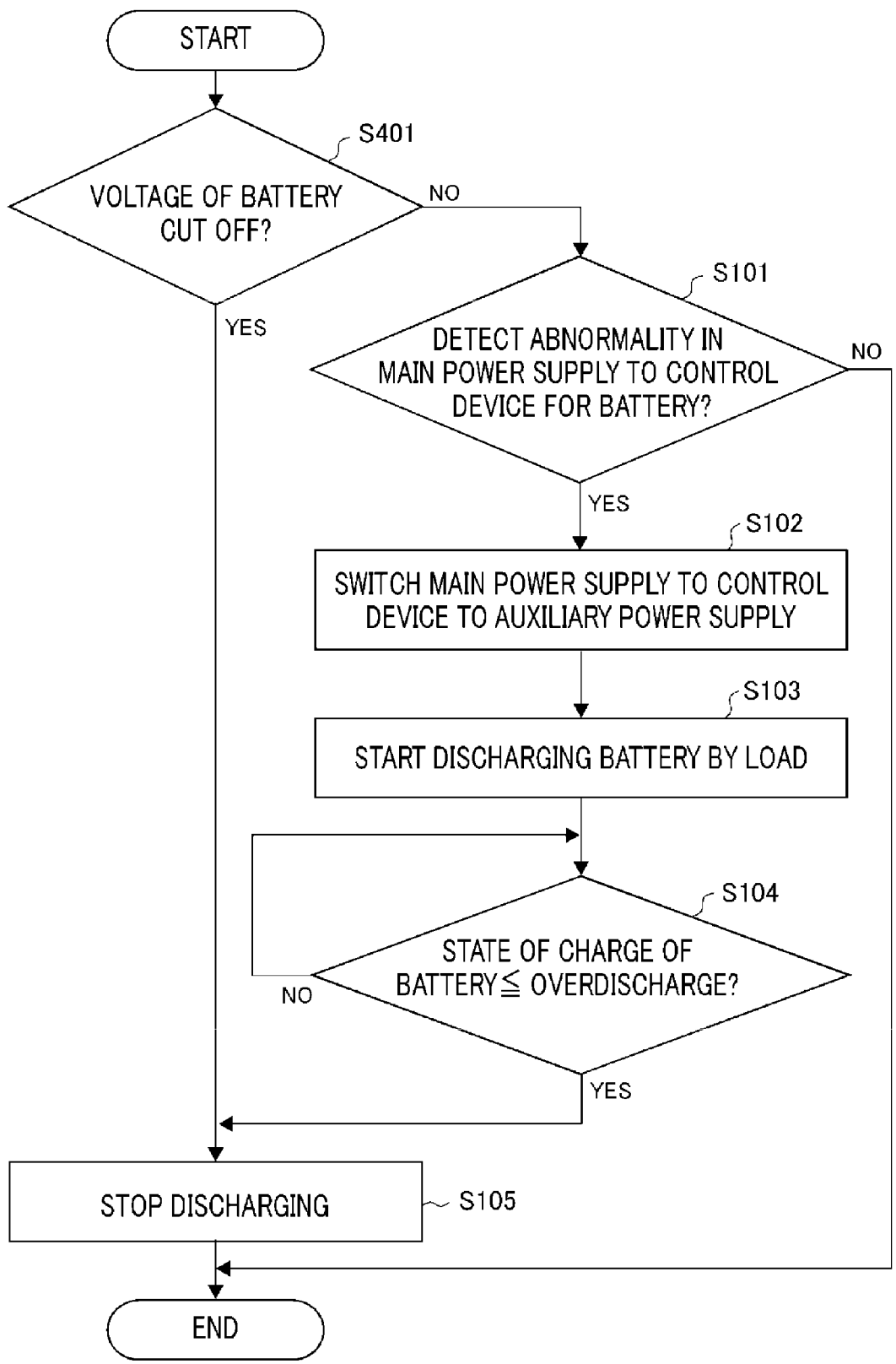
FIG. 12 is a diagram showing the flow of the process in a control device in the on-vehicle electrical storage apparatus according to the eighth embodiment of the invention.

Next, the process flow of the control device 5 in the on-vehicle electrical storage apparatus according to the eighth embodiment will be described with reference to the flow-chart of FIG. 12. The process operation of the control device 5 is performed periodically (for example, every 10 ms).

First, at step 401 (S401), it is determined whether or not the connection with the battery 3 is cut off by the cut-off device 19. If the voltage of the battery 3 is cut off (YES), the process proceeds to S105, wherein the discharging of the battery 3 caused by the discharging means is stopped. At S401, if the voltage of the battery 3 is not cut off (NO), the process proceeds to S101.

Figure 2:
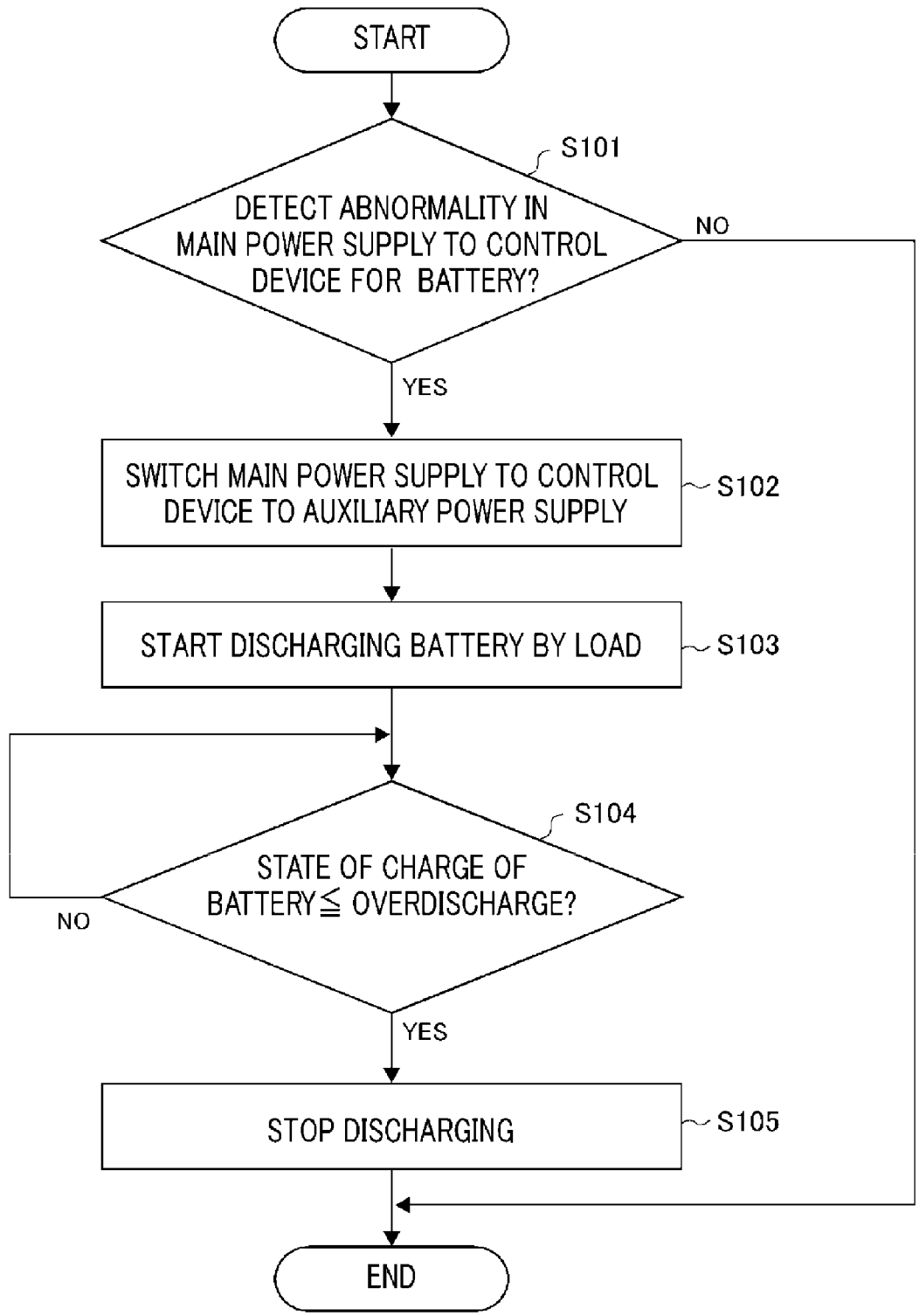
FIG. 2 is a diagram showing the flow of the process in a control device in the on-vehicle electrical storage apparatus according to the first embodiment of the invention.

S101 to S104 are the same as those in the flow-chart of FIG. 2, which has been explained in the foregoing first embodiment. Therefore, the description thereof will be omitted. In FIG. 12, the determination as to whether or not the connection with the battery 3 is cut off at S401 is carried out before S101, but the determination at S401 may be carried out after S101, S102, and S103.

According to the eighth embodiment, the cut-off device 19 for cutting off the connection between the battery 3 and the electrical equipment 12 of the vehicle is provided. Therefore, in addition to the same advantageous effects as those of the foregoing first embodiment, it is possible to prevent electric shocks to the user, and it is also possible to prevent power consumption of the battery 3.

Ninth Embodiment

The configuration of an on-vehicle electrical storage apparatus according to a ninth embodiment of the invention is substantially the same as that of the foregoing first embodiment. Therefore, the description thereof will be given referring again to FIG. 1. The control device 5 of the on-vehicle electrical storage apparatus according to the ninth embodiment is provided with battery abnormality detecting means (not shown) for detecting an abnormality in the battery 3. The rest of the configuration is the same as that in the foregoing first embodiment, and therefore, the description thereof will be omitted.

The control device 5 performs abnormality detection for the battery 3 by the battery abnormality detecting means after starting the discharging by the discharging means. Specifically, an abnormality in the battery 3 is detected by, for example, changes of the temperature and the voltage of the battery 3. If an abnormality in the battery 3 is detected by the battery abnormality detecting means, the battery 3 is discharged by the discharging means until the state of charge thereof becomes approximately 0 (zero). If no abnormality in the battery 3 is detected, the discharging of the battery 3 by the discharging means is stopped before the battery 3 is overdischarged.

Figure 13:
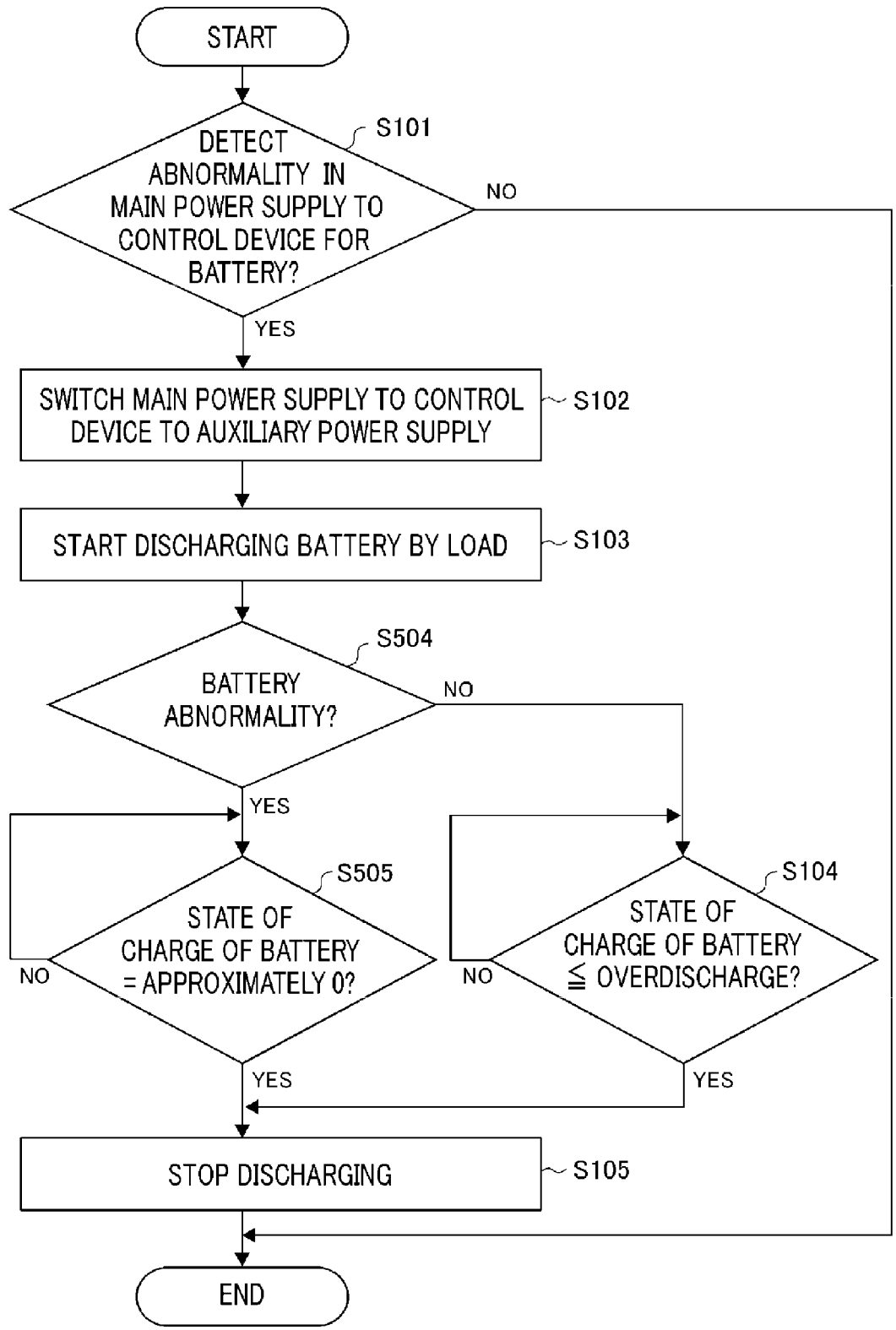
FIG. 13 is a diagram showing the flow of the process in a control device in an on-vehicle electrical storage apparatus according to a ninth embodiment of the invention.

The process flow of the control device 5 in the on-vehicle electrical storage apparatus according to the ninth embodiment will be described with reference to the flow-chart of FIG. 13. The process operation of the control device 5 is performed periodically (for example, every 10 ms). S101 to S103 and S104 are the same as those in the flow-chart of FIG. 2, which has been explained in the foregoing first embodiment. Therefore, the description thereof will be omitted.

At S103, the discharging of the battery 3 is started, and thereafter, at step 504 (S504), it is determined by the battery abnormality detecting means whether or not the battery 3 is abnormal. At S504, if it is determined that the battery 3 is abnormal (YES), the process proceeds to step 505 (S505), wherein it is determined whether or not the state of charge of the battery 3 is approximately 0. If the state of charge of the battery 3 is approximately 0 (YES), the process proceeds to S105, wherein the discharging is stopped.

At S505, if the state of charge of the battery 3 is not approximately 0 (NO), the discharging is continued, and the determination at S505 is repeated. On the other hand, if it is not determined that the battery 3 is abnormal (NO) at S504, the process proceeds to S104, wherein it is determined whether or not the state of charge of the battery 3 is equal to or less than a predetermined value at which overdischarge occurs. In FIG. 13, the discharging is stopped at S105 if the state of charge of the battery 3 becomes approximately 0 at S505. However, the discharging may not necessarily be stopped.

According to the ninth embodiment, if an abnormality in the battery 3 is detected by the battery abnormality detecting means, the battery 3 is discharged until the state of charge of the battery 3 becomes approximately 0 to lower the energy of the battery 3. Therefore, it is possible to prevent ignition or smoke emission at the time of internal short circuit in the battery 3, in addition to the same advantageous effects as those of the foregoing first embodiment. Moreover, if it is not determined that the battery 3 is abnormal, the discharging is stopped before overdischarge occurs. Therefore, overdischarge of the battery 3 can be prevented, and the battery 3 can be reused.

Depending on the state of internal short circuit of the battery 3 (for example, when it is a micro-short circuit), it may take time to detect the abnormality in the battery 3 because the voltage change or the temperature change in the battery 3 may be gradual. However, by starting the discharging and thereafter performing the abnormality detection in the battery 3 by the battery abnormality detecting means, it is possible to discharge the battery 3 to the voltage at which electric shocks can be prevented, without waiting for the result of the abnormality determination.

Tenth Embodiment

Figure 14:
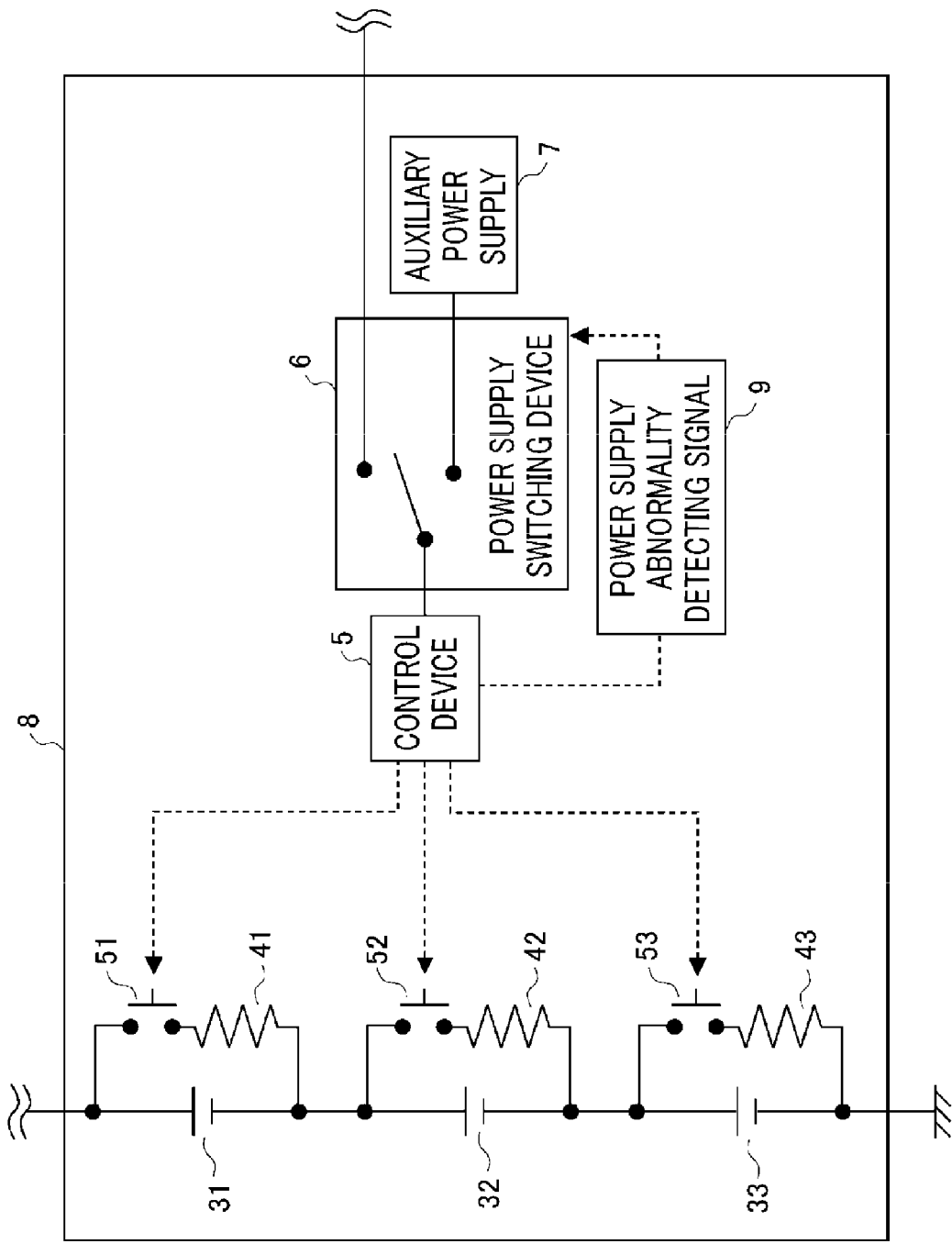
FIG. 14 is a configuration diagram showing an on-vehicle electrical storage apparatus according to a tenth embodiment of the invention.

FIG. 14 shows an on-vehicle electrical storage apparatus according to a tenth embodiment of the invention. FIG. 14 shows only the inside of the case 8. However, the rest of the configuration is the same as that in the foregoing first embodiment (FIG. 1). Therefore, the description thereof will be omitted.

The battery of the on-vehicle electrical storage apparatus according to the tenth embodiment is a battery module in which a plurality of battery cells 31, 32, 33 are connected in series. In addition, as the load for discharging, a bypass circuit including resistors 41, 42, 43 and circuit open/close means 51, 52, 53 is connected in parallel to each of the battery cells 31, 32, 33. The circuit open/close means 51, 52, 53 are opened and closed by the control device 5.

Although the battery cells 31, 32, 33 are connected in series in FIG. 14, the configuration of the battery module is not limited thereto. For example, the battery cells may be coupled in parallel, or the connection may be a combination of series and parallel connection.

The battery abnormality detecting means (not shown) of the control device 5 detects an abnormality in each of the battery cells 31, 32, 33. If an abnormality in any of the battery cells 31, 32, 33 is detected by the battery abnormality detecting means, the applicable battery cell is discharged by the discharging means until the state of charge thereof becomes approximately 0 (zero).

In addition, the control device 5 performs abnormality detection for the battery cells 31, 32, 33 by the battery abnormality detecting means after starting the discharging by the discharging means, and if no abnormality is detected, the discharging by the discharging means is stopped before they are overdischarged.

Figure 15:
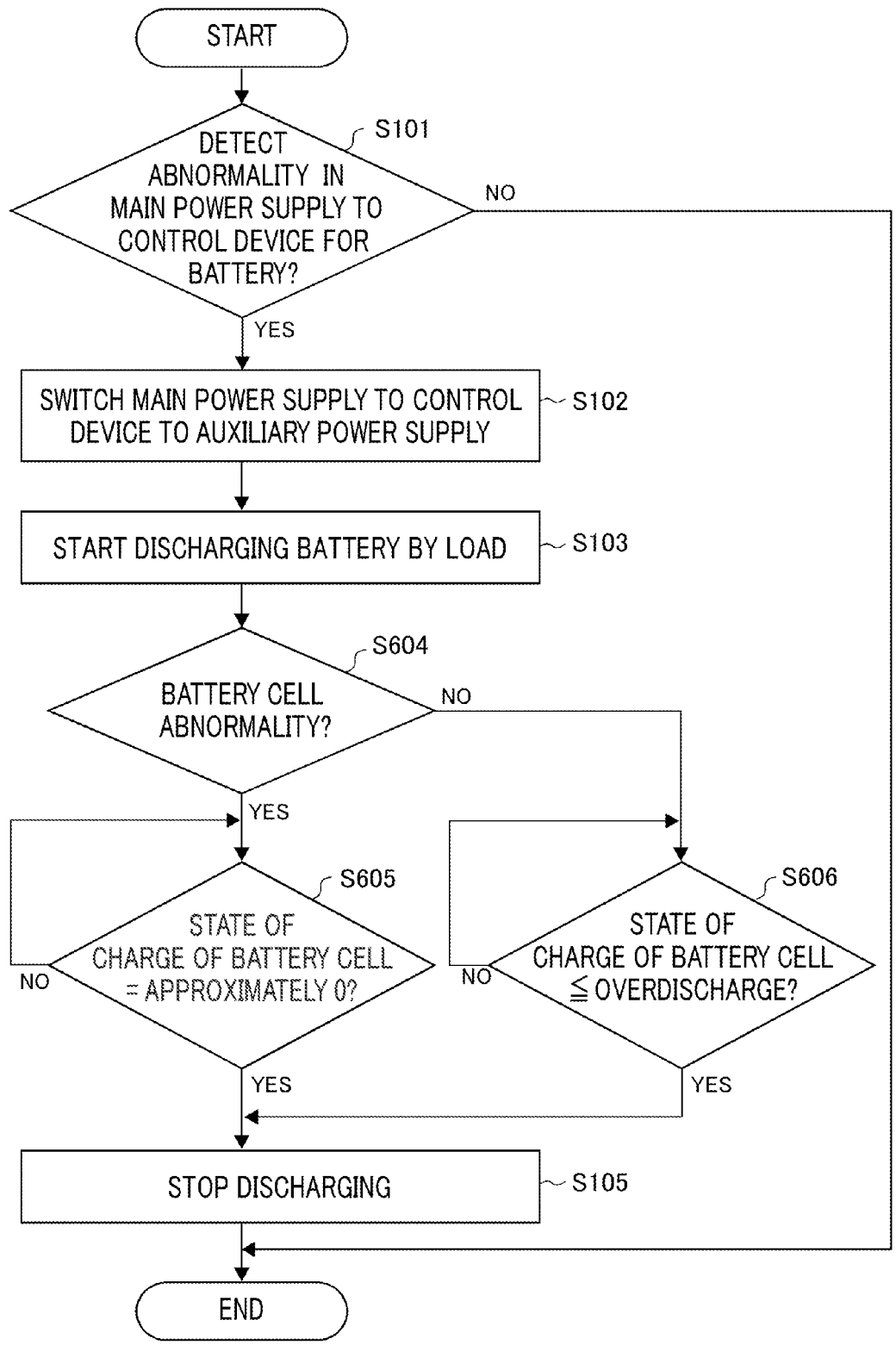
FIG. 15 is a diagram showing the flow of the process in a control device in the on-vehicle electrical storage apparatus according to the tenth embodiment of the invention.

The process flow of the control device 5 in the on-vehicle electrical storage apparatus according to the tenth embodiment will be described with reference to the flow-chart of FIG. 15. The process operation of the control device 5 is performed periodically (for example, every 10 ms). S101 and S102 are the same as those in the flow-chart of FIG. 2, which has been explained in the foregoing first embodiment. Therefore, the description thereof will be omitted.

At S103, the discharging of the battery module is started, and thereafter, at step 604 (S604), it is determined by the battery abnormality detecting means whether or not each of the battery cells 31, 32, 33 is abnormal. At S604, if it is determined that any of the battery cells 31, 32, 33 is abnormal (YES), the process proceeds to step 605 (S605), wherein it is determined whether or not the state of charge of the applicable battery cell is approximately 0. If the state of charge of the applicable battery cell is approximately 0 (YES), the process proceeds to S105, wherein the discharging is stopped.

At S605, if the state of charge of the applicable battery cell is not approximately 0 (NO), the discharging is continued, and the determination at S605 is repeated. On the other hand, if it is not determined that any of the battery cells 31, 32, 33 is abnormal (NO) at S604, the process proceeds to step 606 (S606), wherein it is determined whether or not the state of charge of each of the battery cells 31, 32, 33 is equal to or less than a predetermined value at which overdischarge occurs.

If it is determined that the state-of-charge value of each of the battery cells 31, 32, 33 is equal to or less than the predetermined value at which overdischarge occurs (YES) at S606, the process proceeds to step S105, wherein the discharge stopping means stops the discharging, and the process is ended. If it is not equal to or less than the predetermined value at which overdischarge occurs (NO) at S606, the discharging is continued, and the determination at S606 is repeated. In FIG. 15, the discharging is stopped at S105 if the state of charge of the applicable battery cell becomes approximately 0 at S605. However, the discharging may not necessarily be stopped.

The tenth embodiment can obtain the same advantageous effects as those of the first embodiment and the ninth embodiment. Moreover, because the existing bypass circuit can be used for making the voltages of the battery cells 31, 32, 33 uniform, it is unnecessary to provide an additional bypass circuit for discharging the battery cells 31, 32, 33 in case of a vehicle collision.

Eleventh Embodiment

The configuration of an on-vehicle electrical storage apparatus according to an eleventh embodiment of the invention is substantially the same as that of the foregoing first embodiment. Therefore, the description thereof will be given referring again to FIG. 1. In the eleventh embodiment, the control device 5 stops its operation after stopping the discharging of the battery 3 by the discharge stopping means. The rest of the configuration is the same as that in the foregoing first embodiment, and therefore, the description thereof will be omitted.

Figure 16:
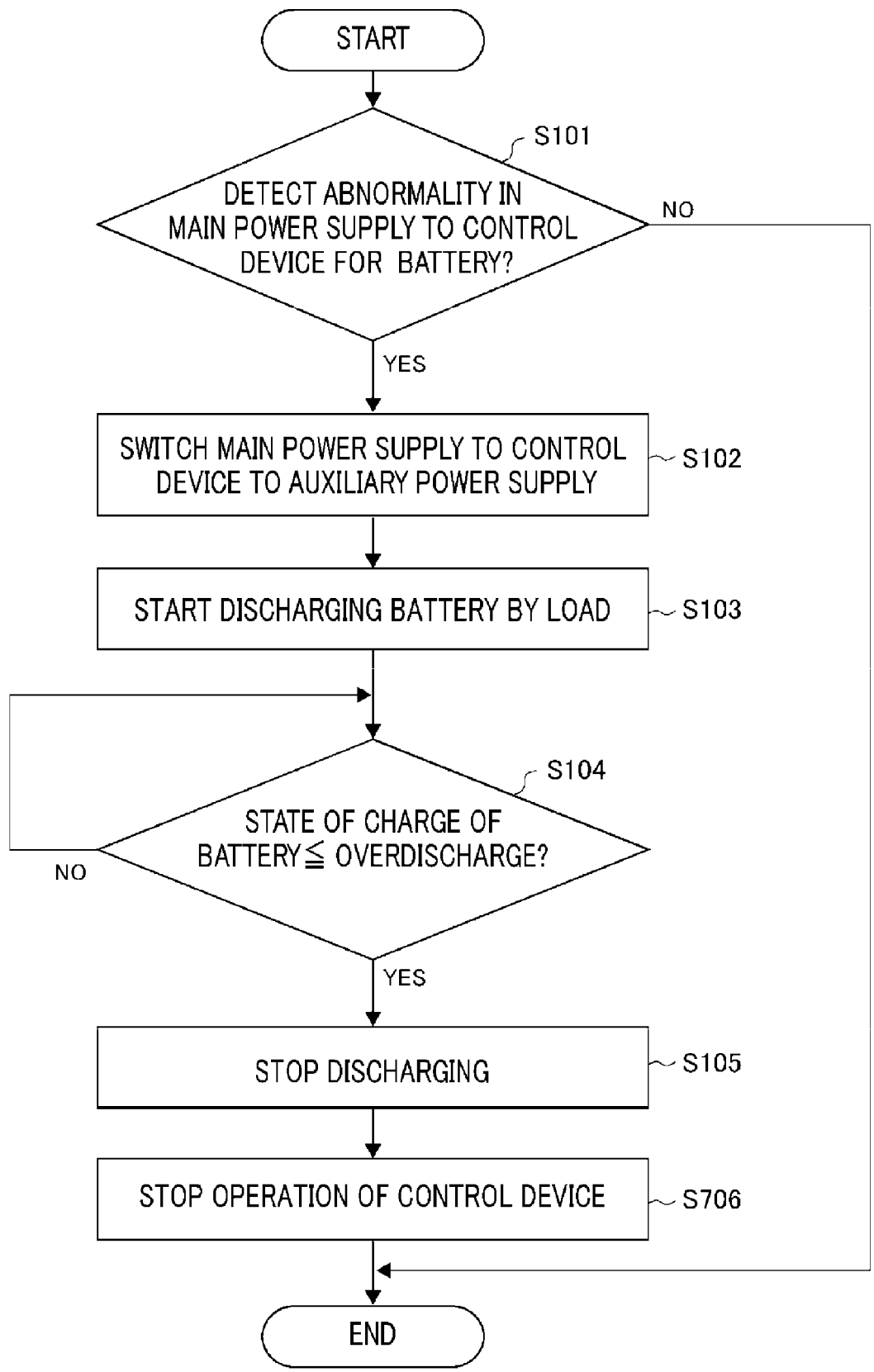
FIG. 16 is a diagram showing the flow of the process in a control device in an on-vehicle electrical storage apparatus according to an eleventh embodiment of the invention.

The process flow of the control device 5 in the on-vehicle electrical storage apparatus according to the eleventh embodiment will be described with reference to the flow-chart of FIG. 16. The process operation of the control device 5 is performed periodically (for example, every 10 ms). S101 to S105 are the same as those in the flow-chart of FIG. 2, which has been explained in the foregoing first embodiment. Therefore, the description thereof will be omitted.

At S105, the discharging of the battery 3 is stopped by the discharge stopping means, and thereafter, the process proceeds to step 706 (S706), wherein the operation of the control device 5 by the auxiliary power supply 7 is stopped. It should be noted that the battery 3 used in the eleventh embodiment may be a battery module as described in the foregoing tenth embodiment.

According to the eleventh embodiment, the power consumption of the auxiliary power supply 7 that originates from the operation of the control device 5 can be prevented, in addition to the same advantageous effects as those of the foregoing first embodiment. Moreover, in the case where the auxiliary power supply 7 is a lithium-ion battery, overdischarge of the lithium-ion battery can be prevented. It is possible to prevent decomposition of the electrolyte solution, and it is possible to prevent the copper used for the negative electrode from being turned into ions and dissolved in the electrolyte solution.

Twelfth Embodiment

Figure 17:
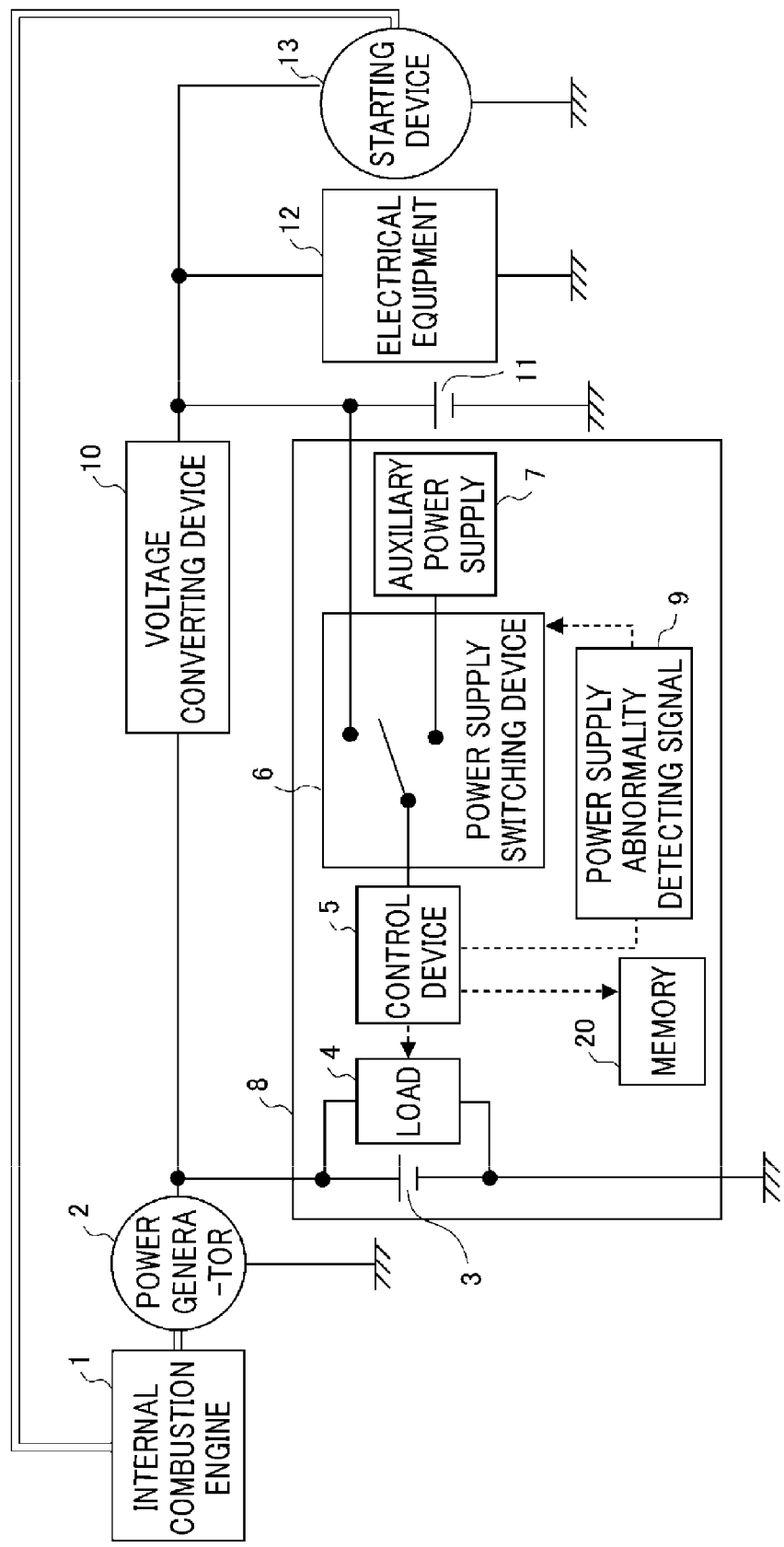
FIG. 17 is a diagram showing the configuration of a power supply system of an internal combustion engine that includes an on-vehicle electrical storage apparatus according to a twelfth embodiment of the invention.

FIG. 17 shows one example of a power supply system of an internal combustion engine that includes an on-vehicle electrical storage apparatus according to a twelfth embodiment of the invention. The on-vehicle electrical storage apparatus according to the twelfth embodiment is provided with a memory that is memory means for storing the record of the discharging of the battery 3 caused by the discharging means. The rest of the configuration is the same as that in the foregoing first embodiment, and therefore, the description thereof will be omitted.

The memory 20 stores the record of discharging of the battery 3 due to an accident, the record of abnormality detection in the battery 3, and the like. Although the memory 20 is provided external to the control device 5 in FIG. 17, it is possible to provide the memory 20 in the control device 5. In addition, the memory 20 may be either non-volatile or volatile.

According to the twelfth embodiment, the memory 20 for storing the record of discharging of the battery 3 is provided. Therefore, in addition to the same advantageous effects as those of the foregoing first embodiment, it is possible to determine whether or not the battery 3 can be reused without directly measuring the voltage or the temperature of the battery 3.

Thirteenth Embodiment

Figure 18:
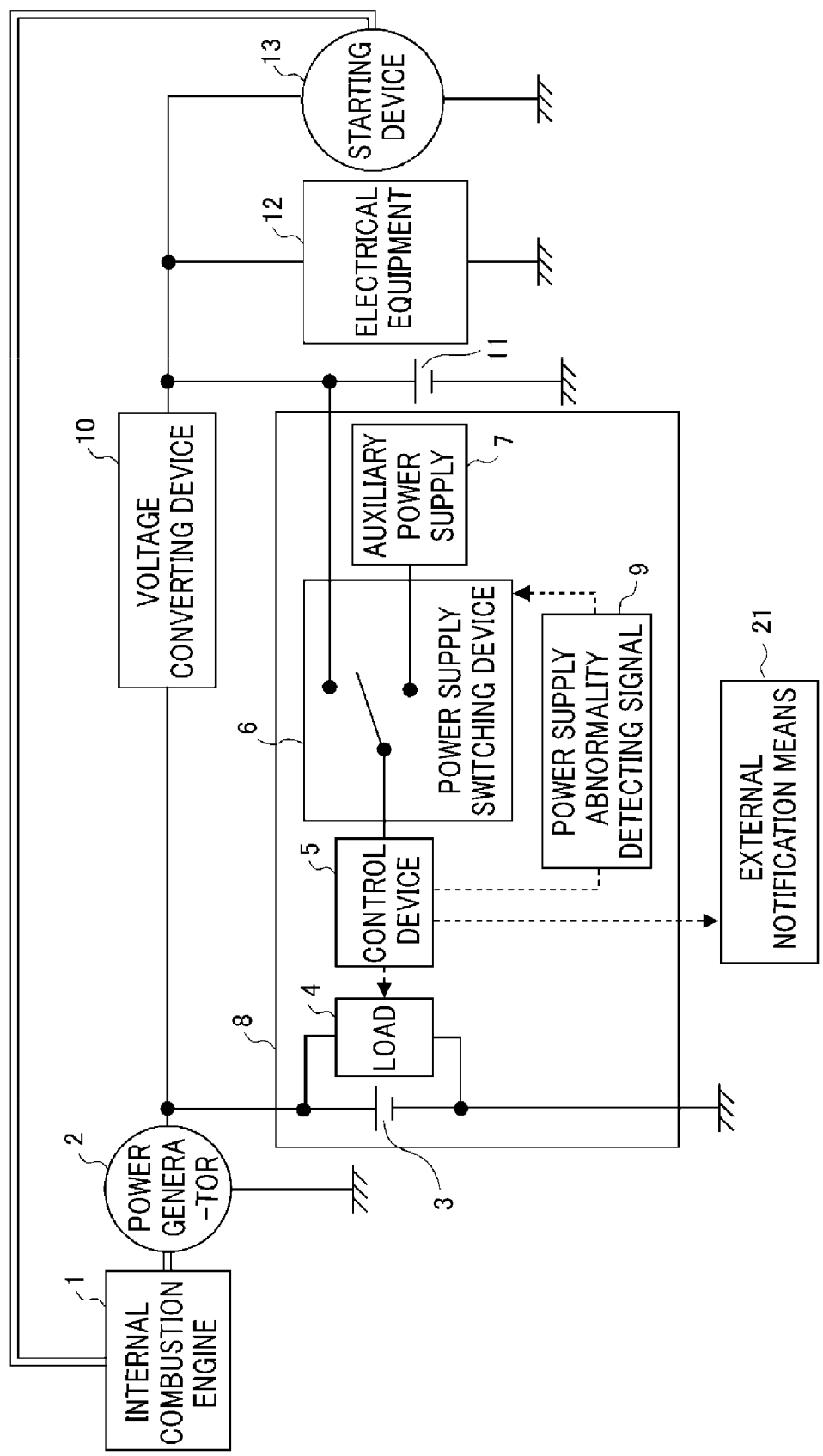
FIG. 18 is a diagram showing the configuration of a power supply system of an internal combustion engine that includes an on-vehicle electrical storage apparatus according to a thirteenth embodiment of the invention.

FIG. 18 shows one example of a power supply system of an internal combustion engine that includes an on-vehicle electrical storage apparatus according to a thirteenth embodiment of the invention. The on-vehicle electrical storage apparatus according to the thirteenth embodiment is provided with external notification means 21 for notifying an external part that the battery 3 is being discharged or has completed discharging by the discharging means. The rest of the configuration is the same as that in the foregoing first embodiment, and therefore, the description thereof will be omitted.

The external notification means 21 may be, for example, an LED lamp, and it is provided in the vehicle to let the user or the rescuer to know the state of charge of the battery 3. It is possible to provide two external notification means that respectively indicate discharging being in progress and completion of discharging. Also, in order to distinguish between discharging being in progress and completion of discharging, it is possible to light up lamps with different colors, or to emit different alarm sounds.

The thirteenth embodiment is provided with the external notification means 21 for notifying an external part that the battery 3 is being discharged or has completed discharging.

Therefore, in addition to the same advantageous effects as those of the foregoing first embodiment, the discharge state of the battery 3 can be easily checked, and electric shocks can be prevented.

In the present invention, the respective embodiments can be freely combined and appropriately changed or omitted within the scope of the present invention.

INDUSTRIAL APPLICABILITY

The invention can be applied to an on-vehicle electrical storage apparatus.

The invention claimed is:

1. An on-vehicle electrical storage apparatus including a battery incorporated in a vehicle and transferring electric power to and from equipment of the vehicle, a load for discharging the battery, a control device for controlling the discharging of the battery by the load, and power source to supply electric power to the control device, characterized in that:

the control device has a state-of-charge detector to detect a state of charge of the battery, a processor to discharge the battery by the load and to stop the discharge of the battery before the battery is overdischarged, based on the state of charge of the battery that is detected by the state-of-charge detector; and the power source has a plurality of electric power supply paths each including a power supply and a power supply line connecting the power supply to the control device so that, if an abnormality occurs in one of the paths that is supplying electric power to the control device, electric power can be supplied to the control device by another one of the paths.

2. The on-vehicle electrical storage apparatus according to claim 1, characterized in that the power source includes a plurality of the power supplies.

3. The on-vehicle electrical storage apparatus according to claim 2, characterized in that the plurality of power supplies include a main power supply and an auxiliary power supply, and characterized by further including a power supply switching device to switch the power supply for supplying electric power to the control device from the main power supply to the auxiliary power supply if an abnormality in the main power supply is detected.

4. The on-vehicle electrical storage apparatus according to claim 3, characterized in that the auxiliary power supply is a different one from the battery.

5. The on-vehicle electrical storage apparatus according to claim 3, characterized in that the auxiliary power supply is the battery.

6. The on-vehicle electrical storage apparatus according to claim 2, characterized in that each of the plurality of power supplies is connected to the control device via reverse current preventing device.

7. The on-vehicle electrical storage apparatus according to claim 6, characterized in that all the plurality of power supplies are different ones from the battery.

8. The on-vehicle electrical storage apparatus according to claim 6, characterized in that the plurality of power supplies include the battery.

9. The on-vehicle electrical storage apparatus according to claim 1, characterized in that the power source includes a plurality of power supply lines for one power supply.

10. The on-vehicle electrical storage apparatus according to claim 9, characterized in that the plurality of power supply lines include a main power supply line and an auxiliary power supply line, and characterized by further including a power supply line switching device to switch the power supply line for supplying electric power to the control device from the main power supply line to the auxiliary power supply line if an abnormality in the main power supply line is detected.

11. The on-vehicle electrical storage apparatus according to claim 9, characterized in that each of the plurality of power supply lines is connected to the control device via reverse current preventing device.

12. The on-vehicle electrical storage apparatus according to claim 1, characterized by further including vehicle collision detector for detecting or predicting a collision of the vehicle, so that if a collision is detected or predicted by the vehicle collision detector, the controlling device performs discharging of the battery.

13. The on-vehicle electrical storage apparatus according to claim 1, characterized by further including a cut-off device to cut off connection between the battery and the equipment, so as to stop discharging of the battery if the connection between the battery and the equipment is cut off by the cut-off device.

14. The on-vehicle electrical storage apparatus according to claim 1, characterized in that the control device includes battery abnormality detector to detect an abnormality in the battery, so that if an abnormality in the battery is detected by the battery abnormality detector, the battery is discharged until a state of charge thereof becomes approximately 0 (zero).

15. The on-vehicle electrical storage apparatus according to claim 14, characterized in that the battery is a battery module having a plurality of battery cells connected in series or in parallel, the battery abnormality detector detects an abnormality in each of the battery cells, and if an abnormality in the battery cells is detected by the battery abnormality detector, an applicable one of the battery cells is discharged until a state of charge thereof becomes approximately 0 (zero).

16. The on-vehicle electrical storage apparatus according to claim 14, characterized in that the control device performs the abnormality detection of the battery by the battery abnormality detector after starting the discharging of the battery.

17. The on-vehicle electrical storage apparatus according to claim 1, characterized in that the control device stops its operation after stopping discharging of the battery.

18. The on-vehicle electrical storage apparatus according to claim 1, characterized by further including a memory to store a record of discharging of the battery.

19. The on-vehicle electrical storage apparatus according to claim 1, characterized by further including a external notification device for notifying an external part that the battery is being discharged or has completed discharging.

20. The on-vehicle electrical storage apparatus according to claim 1, characterized in that a lithium-ion battery is used as the battery.

* * * * *